US005805973A

United States Patent [19]
Coffinberry et al.

[11] Patent Number: 5,805,973
[45] Date of Patent: Sep. 8, 1998

[54] COATED ARTICLES AND METHOD FOR THE PREVENTION OF FUEL THERMAL DEGRADATION DEPOSITS

[75] Inventors: George A. Coffinberry, West Chester, Ohio; John F. Ackerman, Cheyenne, Wyo.

[73] Assignee: General Electric Company, Cincinnati, Ohio

[21] Appl. No.: 816,129

[22] Filed: Mar. 12, 1997

Related U.S. Application Data

[63] Continuation of Ser. No. 592,244, Jan. 26, 1996, abandoned, which is a continuation of Ser. No. 125,964, Sep. 23, 1993, abandoned, which is a continuation-in-part of Ser. No. 6,104, Jan. 15, 1993, abandoned, which is a continuation-in-part of Ser. No. 949,593, Sep. 22, 1992, abandoned, which is a continuation-in-part of Ser. No. 673,924, Mar. 25, 1991, abandoned.

[51] Int. Cl.$^6$ .............................. F02B 75/08; F02B 77/02; C10G 9/16; C23C 16/40
[52] U.S. Cl. ........................... 428/551; 428/552; 428/553; 428/565; 123/668; 208/48 R; 427/126.3; 427/248.1; 427/255; 585/950
[58] Field of Search .............................. 427/126.3, 248.1; 431/3; 123/668, 670; 203/7, 89; 208/48 R; 422/241, 312; 585/950; 428/548, 551, 552, 553, 565

[56] References Cited

U.S. PATENT DOCUMENTS

| | | | |
|---|---|---|---|
| 1,869,077 | 7/1932 | Prentice | 123/668 |
| 2,044,416 | 6/1936 | Atwell | 202/36 |
| 2,433,943 | 1/1948 | Zwicky et al. | 60/35.6 |
| 2,542,953 | 2/1951 | Wiliams, Jr. | 60/41 |
| 2,698,512 | 1/1955 | Schirmer et al. | 60/209 |
| 2,782,592 | 2/1957 | Kolfenbach et al. | 60/209 |
| 2,794,316 | 6/1957 | Winternitz | 60/209 |

(List continued on next page.)

FOREIGN PATENT DOCUMENTS

| | | | |
|---|---|---|---|
| 0022349 | 1/1981 | European Pat. Off. | |
| 0038212 | 10/1981 | European Pat. Off. | |
| 0 110 486 | 6/1984 | European Pat. Off. | |
| 0 414 270 | 2/1991 | European Pat. Off. | |
| 0 479 375 | 4/1992 | European Pat. Off. | |
| 2 144 823 | 2/1973 | France | |
| 2662704 | 12/1991 | France | 208/48 R |
| 1518875 | 9/1969 | Germany | |
| 3928480 | 4/1990 | Germany | 123/668 |
| 61-178514 | 8/1986 | Japan | 123/668 |
| 1141909 | 10/1965 | United Kingdom | |
| 8909294 | 10/1989 | WIPO | |

OTHER PUBLICATIONS

English translation of Laid Open Patent Application JP57–12829 (Laid Open Date: Jan. 22, 1982).
English translation of Laid Open Patent Application JP56–30514 (Laid Open Date: Mar. 27, 1981).

(List continued on next page.)

*Primary Examiner*—Bruce F. Bell
*Assistant Examiner*—Chrisman D. Carroll
*Attorney, Agent, or Firm*—Andrew C. Hess; David L. Narciso

[57] ABSTRACT

Articles for hot hydrocarbon fluid wherein the surface for contacting the fluid is a metal oxide, amorphous glass or metal fluoride diffusion barrier material coated on a metal substrate. The metal oxide, amorphous glass or metal fluoride is deposited by chemical vapor deposition (CVD), e.g., by effusive CVD of an organometallic compound on the surface without the use of carrier gas, without pre-oxidation of the surface and without thermal decomposition of the diffusion barrier coating material. Examples of coating materials deposited by effusive CVD are $SiO_2$, $TiO_2$, spinel and $Al_2O_3$. The articles having the coated surfaces find utility in components subjected to high temperatures wherein the components are in contact with hydrocarbon fluids without additives, without special attention to quality control and without the need for special processing.

21 Claims, 10 Drawing Sheets

U.S. PATENT DOCUMENTS

| | | | |
|---|---|---|---|
| 2,959,915 | 11/1960 | Dille et al. | 60/209 |
| 3,039,720 | 6/1962 | Torell | 244/74 |
| 3,049,872 | 8/1962 | Johnston et al. | 60/210 |
| 3,157,990 | 11/1964 | Ward | 60/218 |
| 3,164,955 | 1/1965 | Garraway | 60/35.3 |
| 3,173,247 | 3/1965 | Smith et al. | 60/206 |
| 3,177,656 | 4/1965 | Tick et al. | 60/35.6 |
| 3,234,580 | 2/1966 | Keck | 431/3 |
| 3,236,046 | 2/1966 | Wellman | 60/218 |
| 3,382,679 | 5/1968 | Spoerlein | 60/267 |
| 3,467,583 | 9/1969 | Naimer | 204/9 |
| 3,475,192 | 10/1969 | Langley | 117/33.3 |
| 3,540,863 | 11/1970 | Priceman et al. | 29/191.2 |
| 3,667,221 | 6/1972 | Taylor | 60/39.74 R |
| 3,690,100 | 9/1972 | Wolf et al. | 60/206 |
| 3,691,762 | 9/1972 | Ryberg et al. | 60/39.51 R |
| 3,692,696 | 9/1972 | Kravitz et al. | 252/439 |
| 3,722,220 | 3/1973 | Wolf et al. | 60/267 |
| 3,733,826 | 5/1973 | Wolf et al. | 60/263 |
| 3,827,967 | 8/1974 | Nap et al. | 208/48 R |
| 3,861,141 | 1/1975 | Neuffer | 60/267 |
| 3,890,088 | 6/1975 | Ferri | 431/351 |
| 3,922,849 | 12/1975 | Kors et al. | 60/39.51 R |
| 3,940,923 | 3/1976 | Pfefferle | 60/39.06 |
| 3,973,395 | 8/1976 | Markowski | 60/39.65 |
| 4,045,956 | 9/1977 | Markowski | 60/39.65 |
| 4,078,604 | 3/1978 | Christl et al. | 165/133 |
| 4,084,371 | 4/1978 | Howald | 60/39.36 |
| 4,112,676 | 9/1978 | De Corso | 60/39.71 |
| 4,215,535 | 8/1980 | Lewis | 60/736 |
| 4,262,482 | 4/1981 | Roffe et al. | 60/736 |
| 4,277,525 | 7/1981 | Nakayama et al. | 427/387 |
| 4,297,150 | 10/1981 | Foster et al. | 148/6.3 |
| 4,343,658 | 8/1982 | Baker et al. | 148/6.3 |
| 4,408,461 | 10/1983 | Bruhwiler et al. | 60/737 |
| 4,429,527 | 2/1984 | Teets | 60/39.06 |
| 4,454,021 | 6/1984 | Watanabe et al. | 208/48 R |
| 4,480,436 | 11/1984 | Maclin | 60/39.32 |
| 4,529,626 | 7/1985 | Baker et al. | 427/226 |
| 4,530,340 | 7/1985 | Totman | 123/669 |
| 4,561,257 | 12/1985 | Kwan et al. | 60/737 |
| 4,563,875 | 1/1986 | Howald | 60/39.23 |
| 4,582,476 | 4/1986 | Altemark et al. | 431/8 |
| 4,612,880 | 9/1986 | Brass et al. | 123/1 A |
| 4,655,044 | 4/1987 | Dierberger et al. | 60/753 |
| 4,692,313 | 9/1987 | Watanabe et al. | 422/241 |
| 4,787,208 | 11/1988 | De Corso | 60/723 |
| 4,838,029 | 6/1989 | Gleason | 60/732 |
| 4,893,468 | 1/1990 | Hines | 60/39.05 |
| 4,894,986 | 1/1990 | Etheridge | 60/258 |
| 4,910,957 | 3/1990 | Moreno et al. | 60/39.06 |
| 4,912,931 | 4/1990 | Joshi et al. | 60/732 |
| 4,942,732 | 7/1990 | Priceman | 60/261 |
| 4,972,811 | 11/1990 | Baresel et al. | 123/143 B |
| 5,169,515 | 12/1992 | Ngan et al. | 208/48 R |

OTHER PUBLICATIONS

The American Society of Mechanical Engineers, "Deposits from Heated Gas Turbine Fuels", by E.J. Szetela, United Technologies Research Center, East Hartford, CT, p. 1–5, presented at Gas Turbine and Fluids Engineering Conference, New Orleans, LA, Mar. 21–25, 1976.

Kirk–Othmer, "Encyclopedia of Chemical Technology", vol. 3, 34th Ed. (1979), pp. 328–351 Aviation and Other Gas Turbine Fuel.

Kirk–Othmer, "Encyclopedia of Chemical Technology", vol. 15, 3rd Ed. (1981), pp. 252–269 –Metallic Coating (Survey).

Chemistry of Combustion Reactions, Minoff et al., pp. 346–347 (1962).

NASA Technical Memorandum 83420, "Research on Aviation Fuel Instability", by Charles E. Baker, David A. Bittker, Stephen M. Cohen and Gary T. Seng, Lewis Research Center, Cleveland, Ohio, prepared for the AGARD Propulsion & Energetics Panel Symposium on Combustion Problems in Turbine Engines, Cesme, Turkey, Oct. 3–7, 1983, pp. 2–1–2–7.

COATED ARTICLES AND METHOD FOR THE PREVENTION OF FUEL THERMAL DEGRADATION DEPOSITS

This application is a continuation of U.S. Ser. No. 08/592,244, filed Jan. 26, 1996, now abandoned, which is a continuation of U.S. Ser. No. 08/125,964, filed Sep. 23, 1993, now abandoned, which is a continuation-in-part of U.S. Ser. No. 08/006,104, filed Jan. 15, 1993, now abandoned, which is a continuation-in-part of U.S. Ser. No. 08/949,593, filed Sep. 22, 1992, now abandoned, which is a continuation-in-part of U.S. Ser. No. 08/673,924, filed Mar. 25, 1991, now abandoned, the contents of all which is relied upon and incorporated by reference herein.

BACKGROUND OF THE INVENTION

The present invention relates generally to deposits formed on surfaces in contact with hydrocarbon fluids, and more particularly, to a method of preventing or reducing the deposit of hydrocarbon fluid thermal degradation products on surfaces in contact therewith and to a metal article having a coated surface which inhibits the formation of gum and/or coke formed by thermal degradation of the fluid, without resorting to modification of the fluid, without adoption of special procedures and without installation of special equipment for their use.

As used herein, hydrocarbon fluid is defined as one or more hydrocarbon liquids, hydrocarbon gases or mixtures thereof. As used herein, "hydrocarbon fluid degradation products" or "thermal degradation products" includes products which form from the hydrocarbons, for example, certain polymers resulting from thermal transformation of paraffins to cycloparaffins, aromatics and polycyclic molecules in the hydrocarbon, as well as products which result from actual decomposition of the fuel, e.g., carbon.

Because high temperature is usually associated with undesirable levels of hydrocarbon fluid deposit formation, the technical subject herein is customarily referred to as thermal instability, or in the case of fuels, as fuel instability. Flowing hydrocarbon fluids including lubricating oils, hydraulic oils and combustible fuels form gum and coke deposits on the surface of containment walls and other parts which they contact, when the fluid and/or surface are heated.

The mechanisms for formation of deposits from thermal instability have been studied and documented. In the case of fuels, it is generally accepted that there are two distinct mechanisms occurring at two levels of temperature. In the first mechanism, referred to as the coking process, as temperature increases from room temperature, starting at about 300° F. (about 149° C.) there is generally a consistent increase in the rate of formation of coke deposits up to about 1200° F. (about 649° C.) where high levels of hydrocarbon lead to coke formation and eventually limit the usefulness of the fuel. A second lower temperature mechanism starting at about room temperature, generally peaks at about 700° F. (about 370° C.) and involves the formation of gum deposits. This second mechanism is generally better understood than the coking process. It involves oxidation reactions which lead to polymerization which includes the formation of gums. Both coke and gum formation and deposits can occur simultaneously in the mid-temperature region.

Coke formation in hydrocarbons is discussed in U.S. Pat. No. 2,698,512, and heat stability of jet fuel and the consequences of thermal degradation of the fuel are discussed in U.S. Pat. No. 2,959,915, both patents being incorporated herein by reference in their entirety. These patents suggest specific formulations which place limitations on the fuel chemistry and impurities associated with hydrocarbon fuels so that the fuels will be usable at high temperatures without the typical formation of gums and coke.

Gum and coke formation are discussed in U.S. Pat. No. 3,173,247, which is incorporated by reference herein in its entirety. It is indicated therein that at very high flight speeds, heat must be transferred, particularly from the engine, to some part of the flight vehicle or to its load, and although the fuel which is stirred on the vehicle, could serve to receive this heat, in practice, such procedure is unfeasible because jet fuels are not stable to the high temperatures which are developed at mutli-Mach speeds, instead, they decompose to produce intolerable amounts of insoluble gum or other deposits, for example coke. As with the previously referenced patents, the solution to the problem has been directed toward limitations on fuel chemistry and impurities associated with the fuel.

The chemistry of the hydrocarbon fluid mixture and the chemistry of the containment vessel can have a major influence on deposit mechanisms and deposit rates at temperatures where it is most desirable to use the fluid. Hydrocarbon fluids contain impurities, of which sulfur and dissolved oxygen from air, are major constituents. Gums are essentially vinyl polymers formed by reactions between oxygen and olefins in hydrocarbon fluids. Coke can also be in the form of carbon polymers and can have crystalline structures, and deposits formed from decomposition products of hydrocarbon fluids, are often observed to be a mixture of gum, coke hydrocarbons and other impurities. Gums adhere to surfaces much in the same way as glues, and accordingly, they tend to entrap other solid particles such as coke, solid hydrocarbon impurities (or products), and the like and thereby form deposits on surfaces which they contact. In the lower temperature region where gum formation occurs, oxygen from air dissolved in the liquid is the major adverse ingredient. Boiling amplifies this adversity because of the oxygen concentration effect adjacent to hot walls. If oxygen is absent, gum formation is not likely to occur.

In much of the prior art, the problems associated with gum and coke thermal deposits have predominately dealt with bulk fluid chemistry and reactions which can take place within the fluid. These investigations have involved a wide range of hydrocarbon compositions and the presence of numerous impurities such as sulfur compounds, nitrogen compounds, oxygen and trace metals. It has been observed that deposits attached to containment walls often contain very large quantities of sulfur and nitrogen compounds or intermediates thereof in addition to gums and cokes. Little attention has, however, been given in the prior art to the role of the chemistry and reactions which take place in the vicinity of the containment walls and the fluid.

In U.S. Pat. No. 3,157,990, certain phosphate additives are added to the monopropellant wherein the phosphates decompose in the reaction chamber and form a coating, probably a phosphate coating, on the internal generator surfaces, and it is suggested that this coating effectively inhibits carbon decomposition and scaling. In U.S. Pat. No. 3,236,046, which is incorporated by reference herein in its entirety, the interior surfaces of stainless steel gas generators are passivated with sulfurous materials to overcome deposition of coke on the surfaces of the gas generator, and passivation is defined as a pretreatment which substantially reduces initial catalytic coke formation.

In U.S. Pat. No. 4,078,604, which is incorporated by reference herein in its entirety, heat exchangers are characterized by thin-walled corrosion resistant layers of electrodeposited gold or similar corrosion-resistant metals on the walls of the cooling channels within the inner wall, and the cooling channels are covered with the electro-deposited layer of gold in order to make the surfaces corrosion resistant to such storable liquid fuels as fuming nitric acid. In this prior art case, the wall is protected from corrosion by the propellant, but the intent is not to prevent deposit formations.

Protective metal oxide films on metal or alloy substrate surfaces susceptible to coking, corrosion or catalytic activity are referred to in U.S. Pat. No. 4,297,150, which is incorporated by reference herein in its entirety, where it is first necessary to pre-oxidize a substrate surface and then to deposit on the pre-oxidized surface a metal oxide of calcium, magnesium, aluminum, gallium, titanium, zirconium, hafnium, tantalum, niobium or chromium by vapor phase decomposition of a volatile compound of the metal, wherein nitrogen, helium, argon, carbon dioxide, air or steam may be used as carrier gases for the metal compound, the volatile compound having at least one metal-oxygen bond.

In U.S. Pat. No. 4,343,658, reference is made to the protection of metal substrate surfaces against carbon accumulation when exposed to an environment wherein carbon-containing gases are decomposed, by the use of tantalum and/or tungsten entities deposited and/or diffused into the surface of the substrate. According to U.S. Pat. No. 4,343,658, which is incorporated by reference herein in its entirety, filamentous carbon grows on surfaces at a reduced rate (by a factor of at least four) when the tantalum and/or tungsten entity deposited on the surface is decomposed at a temperature of 600° C. to 1200° C. to drive tungsten and/or tantalum metal into the substrate surface.

In Japanese patent application No. 57-12829, reference is made to preventing the adhesion of tar by spray coating a blend containing aluminum chloride and cobalt oxide on a surface to provide a coated surface which has a catalytic activity for the decomposition of tar compounds into compounds that can be vaporized at low temperatures. According to Japanese patent application No. 56-30514, when tar collects on a surface which has been spray coated with a blend of a tar decomposing catalyst chosen from titanium oxide, zirconium oxide, vanadium oxide, chromium oxide, molybdenum oxide, tungsten oxide, manganese oxide, iron oxide, cobalt oxide, nickel oxide, copper oxide, platinum, palladium, rhodium, ruthenium, osmium or iridium and an inorganic binder of silicate, aluminum phosphate, glass, lithium, silicate solution, colloidal silica or alumina sol, it can be heated at 350° C. for 60 minutes to remove the tar built up on the surface.

Thermal instability and fuel instability, referred to above, are becoming more significant with developing technology, and it will become even more significant as processes and machinery will be required to operate at higher temperatures as afforded by advances in materials technology and as the chemical quality of hydrocarbons for fuels, oils, lubricants, petrochemical processes (plastics and synthetics) and the like, decreases. Furthermore, hydrocarbon fluids, fuels and oils derived from non-petroleum sources, such as shale and coal, will have significantly more problems with thermal instability because of their high content of olefins, sulfur and other compounds. Accordingly, it is advantageous to provide coated articles and processes for preventing the formation of adverse degradation products and foulants in such applications where thermal instability, including fuel instability, is a problem as a result of exposure of such fluids to high temperatures.

In view of the foregoing, it can be seen that it would be desirable to provide coated metal articles, e.g., fuel containment articles for containing hot hydrocarbon fluid, in which or on which degradation products formed by thermal degradation of the hydrocarbon fluid is avoided, eliminated or reduced. It would also be desirable to provide a method of protecting metal surfaces which contact hot hydrocarbon fluid, from the deposit of degradation products of the hydrocarbon fluid. It can also be seen from the foregoing that it is desirable to provide methods and articles for use with hydrocarbon fuels wherein the hydrocarbon fuel can be used as a heat sink without the undesirable deposit of insoluble gums, coke, sulfur compounds or mixtures thereof on surfaces, e.g., containment surfaces. It is also desirable to provide methods and articles for containment of vaporized fuel to reduce $NO_x$ emission and to provide methods and articles for containment of low quality fuels derived from coal, shale and low grade crude oil.

The disadvantages of the prior art processes and techniques discussed above involve the need to alter the hydrocarbon chemistry, maintain strict control of impurities and/or provide additives and special processing such as pre-oxidizing treatment, passivation treatments and/or post-decomposition heat treatments using excessive amounts of heat, and the like. All of these techniques constrain the use of the fluid, increase cost and promote uncertainty as to the quality level of the fuel or treatment at a particular time. Furthermore, there are a multitude of processes, systems and devices including petrochemical processes, machine tools, automobile engines, aircraft gas turbine engines, and marine and industrial engines in which surface deposits from hydrocarbon fluids, fuels and oils are a major problem. Deposits can foul heat exchangers, plug fuel injectors and lubrication distribution jets, jam control valves and cause problems with many other types of operating and control devices associated with hydrocarbon fluids, fuels and oils. It is a primary objective of this invention to overcome these disadvantages.

SUMMARY OF THE INVENTION

These and other disadvantages are overcome in accordance with the present invention by providing a coating, also referred to as a liner, liner material, coating material, diffusion barrier or diffusion barrier material on a metal surface, also referred to as a substrate. The present invention overcomes the limitations of the prior art as discussed above by providing a method which eliminates or reduces the surface reactions which lead to formation of thermal instability deposits from hydrocarbon fluids and which eliminate or reduce adherence of deposits on surfaces of articles and containers wherein the deposits occur as a result of using ordinary low-cost fuels, oils and other hydrocarbons without focusing special attention to impurities or quality. Thus, coated articles and containers are provided in which the surface reactions which lead to formation of thermal instability deposits from hydrocarbon fluids, have been eliminated.

In accordance with the present invention, there is provided a method for preventing the deposit of degradation products and/or thermal instability deposits from hot hydrocarbon fluids on a metal substrate, and metal surfaces are protected from the deposit of hydrocarbon fluid degradation products resulting from thermal degradation of hot hydrocarbon fluid in a fluid containment article or system carrying hot hydrocarbon fluid. Thus, for example, as a result of the present invention, heat generated by combustion of fuel in the operation of a combustor which utilizes hydrocarbon fuel, or heat from other sources, can be transferred by heat exchange principles to hydrocarbon fuel without the undesirable thermal degradation of the fuel and the subsequent deposit of thermal degradation products on the walls of the articles containing or contacting the fuel.

In one aspect of the present invention, there is provided an article for containing or contacting hot hydrocarbon fluid comprising a substrate having a surface adapted for contact with the hydrocarbon fluid wherein the surface comprises a coating material or certain oxides and/or fluorides which is inert to thermal degradation in the hydrocarbon fluid and inhibits the formation of coke, the oxide, fluoride or mixture thereof inhibiting the formation of gum or sulfur compounds or mixtures thereof formed by thermal degradation of the hydrocarbon fluid, the oxide and/or fluoride coating material being a physical diffusion barrier located between the substrate and hydrocarbon fluid and being deposited or applied by a chemical vapor deposition (CVD) process, e.g., by effusive chemical vapor deposition of an organometallic precursor compound for the particular oxide and/or fluoride deposited as the coating material, wherein the applied oxide and/or fluoride coating material is sufficient to prevent the formation of deposits of material sulfides, metal oxides or mixtures thereof, the deposits resulting from the reaction of sulfur, oxygen or mixtures thereof in hydrocarbon fluid with metal atoms which diffuse to the surface.

In another aspect of the present invention, there is provided a method for preventing the deposit on a metal surface of thermal degradation products selected from metal sulfides, metal oxides or mixtures thereof derived from the reaction of sulfur, oxygen or mixtures thereof in hydrocarbon fluid with metal atoms which diffuse to the surface, comprising applying to the metal surface a diffusion barrier coating comprising a thermally stable metal oxide, amorphous glass, metal fluoride or mixtures thereof, the metal oxide, amorphous glass, metal fluoride or mixtures thereof being applied by chemical vapor deposition, e.g., by effusive chemical vapor deposition of an organometallic compound on the surface without the use of carrier gas, without pre-oxidation of the surface and without thermal decomposition of the diffusion barrier material.

In one preferred embodiment of the present invention, there is provided a method for preventing the deposit on a metal surface of coke derived from hydrocarbon fluid containing sulfur, oxygen or mixtures thereof, in contact with the metal surface for a sufficient residence time to form coke, wherein the residence time sufficient to form coke is the result of the formation on the metal surface of cavities within the metal sulfides formed from the reaction of sulfur and metal atoms which diffuse to the surface, the reaction of metal oxide from the oxygen and metal atoms which diffuse to the surface, or mixtures thereof comprising, applying to the metal surface a diffusion barrier coating comprising a thermally stable oxide and/or fluoride which prevents the formation of metal sulfide, metal oxide or mixtures thereof on the metal surface, the metal oxide, the metal fluoride or mixtures thereof being applied by chemical vapor deposition in accordance with the present invention, e.g., by effusive chemical vapor deposition of an organometallic compound on the surface without the use of carrier gas, without pre-oxidation of the surface and without thermal decomposition of the diffusion barrier material. The coating material itself, i.e., the diffusion barrier material, is inert to chemical reaction with hydrocarbons and hydrocarbon impurities, that is, it is inert to the chemical deformation of such thermal degradation products as gum, coke, sulfur compounds and the like in the fluid.

The coating material is deposited as a layer or layers on a surface which is adapted for contact with a hydrocarbon fluid, for example, a distillate fuel, and it inhibits or prevents the formation of gum, coke, sulfur compounds or mixtures thereof formed by the thermal decomposition of the hydrocarbon fluid. The coating material is also a physical diffusion barrier to the hot hydrocarbon fluid, that is, it will not permit the diffusion of or passing of the fluid through the material to the substrate on which the coating material is deposited. Thus, the metal oxide, amorphous glass and/or metal fluoride is a physical barrier located between the substrate and the hydrocarbon fluid.

From the foregoing, it is evident that the present invention solves the problems related to the formation of gum, coke, sulfur and other reactions which are chemically associated with contact between hot hydrocarbon fluid and the materials which the fluid contacts, for example, a wall. The present invention also solves the problems associated with the attachment or adherence of deposits to materials which the fluid contacts, by either physical means or chemical means or combinations thereof.

Although there is no intention to be bound by any particular theory or explanation of the mechanism(s) by which the present invention inhibits the formation of gum, coke and sulfur compounds which are formed by thermal degradation of hydrocarbon fluid, it is believed that chemical reactions take place between specific atoms and compounds which are part of the substrate chemistry and react under the influence of temperature with hydrocarbons and hydrocarbon impurities such as oxygen and sulfur and their compounds, to form metal-oxygen and metal-sulfur compounds. These metal compounds form deposits and/or precursors to deposits and provide an attachment mechanism between the substrate and other deposits. This theory is supported by the argument that chemical-absorption provides a much stronger surface bond than would simple physical absorption to the surface. In the specific case of gum deposits, it is theorized that metal atoms and metal compounds in the substrate can react to form hydrocarbon radicals which are then highly susceptible to further reaction such as with oxygen, to lead ultimately to polymerization and gums. Substrate reactions can also provide chemistry which is known in the art to be precursors to gums, and after the precursors attach to the substrate, they become the means for which gums and cokes and other deposits can grow by means of chemical or physical means, to consequential proportions.

The prior art, including U.S. Pat. Nos. 4,297,150 and 4,343,658 discussed above, refer to the use of films, including metal oxide films, to inhibit coke formation. Although the purpose of these films is not easily deduced from the prior art, it might be assumed that the theories and reaction mechanisms referred to in the prior art apply in one form or another to the theories and mechanisms of the present invention, there are significant differences and advantages of the present invention over the prior art. As discussed above, like many chemical reactions, coke deposits are believed to be the result of molecular growth, i.e., formation of large molecules containing essentially carbon and hydrogen. In order for such molecular growth to occur, there must be sufficient residence time and availability of reactant species. When hot hydrocarbon fluid containing an impurity, e.g., sulfur, flows over a hot metal or metal alloy surface containing certain metals, e.g., iron, a strong affinity for the formation of iron sulfide causes iron atoms from the metal to diffuse to the surface and react with the sulfur. The iron sulfide formed by this mechanism (iron sulfide being essentially black in color and appearing to be coke) provides the essential means for coke formation. Because the iron sulfide crystals are irregular, the surface is easily wetted by the hydrocarbon fluids, e.g., the hydrocarbon at the surface has long chemical residence time. This, plus the availability of fresh reactants from flowing hydrocarbon contacting the surface causes the formation of coke.

Many coatings and coating materials, including the metal oxide films referred to in the prior art, are too porous to prevent either diffusion of metal atoms, e.g., iron, through the film or coating or to prevent diffusion of the hydrocarbon fluid through the film or coating to the metal substrate. Indeed, the porosity of the film or coatings of the prior art may contribute to the coking problem by trapping the hydrocarbon fluid at high temperature for a finite residence time, i.e., a residence time sufficient to permit formation of coke.

In accordance with the present invention, a metal oxide, amorphous glass and/or metal fluoride deposited by certain CVD processes, e.g., by effusive chemical vapor deposition, on the surface is sufficiently non-porous to shield objectionable metal atoms and metal compounds in the substrate or wall from reaction with impurities in the fuel. The same coating material is also sufficiently non-porous to physically prevent or inhibit diffusion or metal atoms and metal compounds into the hydrocarbon fluid. The same coating material is also sufficiently non-porous to prevent or inhibit diffusion of the hydrocarbon fluid and any impurities that it contains, to the substrate. By the CVD processes of the present invention, e.g., the effusive chemical vapor deposition of an organometallic compound on the surface without the use of carrier gas and without thermal decomposition of the coating deposited by the process, a non-porous diffusion barrier coating having a porosity sufficiently low to prevent or inhibit diffusion of metal atoms from the coated substrate therethrough, and having a porosity sufficiently low to prevent or inhibit diffusion of hydrocarbon fluid and any impurities it contains therethrough, is deposited on a metal surface adaptable to contact hydrocarbon fluids.

Thus, in another aspect of the present invention there is provided a diffusion barrier article with a substrate having a non-oxidized surface coated with a smooth, continuous, contiguous diffusion barrier material of non-porous, atomically tight, dense, thermally stable metal oxide, amorphous glass, metal fluoride or mixtures thereof, said diffusion barrier being adapted to contact a fluid, i.e., the diffusion barrier is on a surface of the article so as to contact a hydrocarbon fluid during use of the article.

The diffusion barrier material of the present invention is generally a catalytically-inactive material. A catalytically-inactive material is one which is inert to the formation of any degradation products in hot hydrocarbon fluid which contacts it. Thus, when such a catalytically-inactive material is used as the liner (diffusion barrier material) on an article adapted to contact hydrocarbon fluid, there is substantially no catalytically-promoted thermal decomposition of the hydrocarbon fluid at elevated temperatures, for example, up to 900° F. (482° C.), and no sulfur compound or coke results or appears in the heated fluid as a result of activity of the diffusion barrier material on the hot hydrocarbons.

BRIEF DESCRIPTION OF THE DRAWINGS

These and various other features and advantages of the invention can be best understood from the following description taken in conjunction with the accompanying drawings in which.

DETAILED DESCRIPTION OF THE INVENTION

Figure 1:
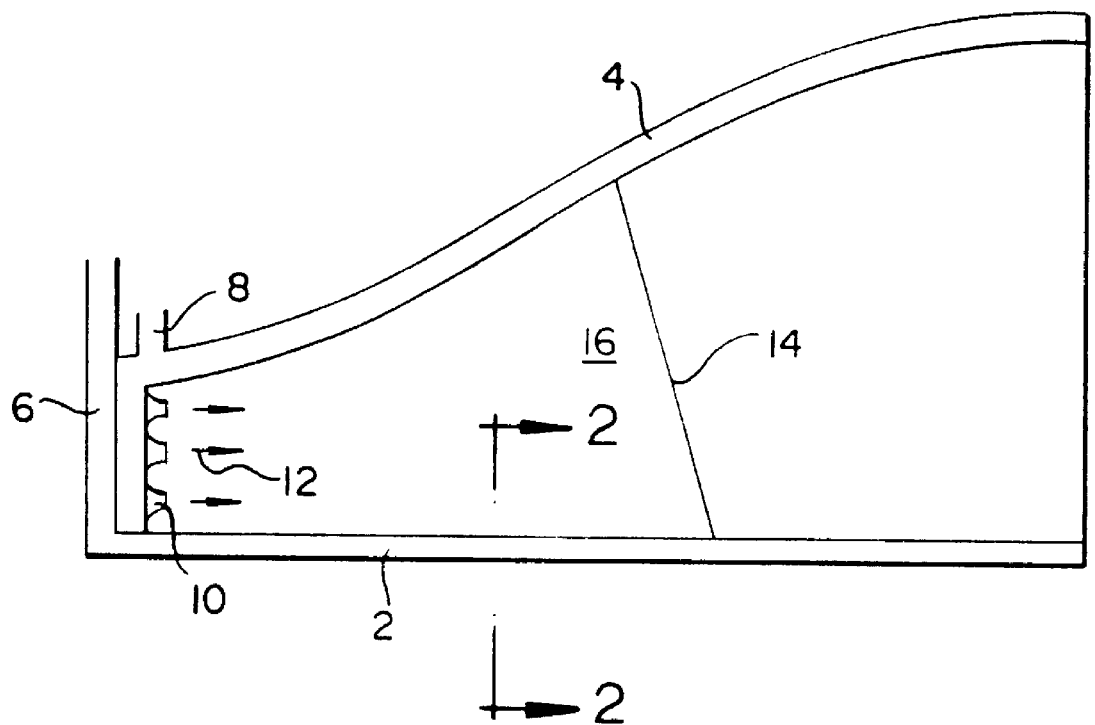
FIG. 1 is a partial longitudinal view of a high pressure turbine nozzle for a jet engine fueled by distillate fuel and incorporating the heat exchanger wall construction of the present invention.

The terms hydrocarbon fluid, hydrocarbon fuel and distillate fuel may be used interchangeably herein.

The invention has applicability to any hydrocarbon fluid or fuel in which gum, coke and/or sulfur compounds form when the fluid is exposed to heat. Although the invention is not directed to or limited by any particular hydrocarbon fluid or hydrocarbon fuel, typical fuels for which the method and fluid containment and other articles of the present invention are adapted, and typical fuels from which the substrates of fluid containment or other articles are protected in accordance with the present invention, are the hydrocarbon or distillate fuels generally discussed above the include natural gas and hydrocarbons and distillation products thereof which are generally liquid at room temperature. The fluids may be mixtures of hydrocarbons, mixtures of such distillation products, mixtures of hydrocarbons and distillation products, gasoline, No. 1 or No. 2 diesel fuels, jet engine fuels, such as Jet-A fuel, or the foregoing fuels mixed with additives which are well-known in the art. Hydrocarbon fuels refer to the liquid fuels which are conventionally used in internal combustion engines, including but not limited to automobile and truck engines, reaction motors, including but not limited to, industrial gas turbines, engines used in jet propelled aircraft or any other gas turbine engine, all of which are conventionally known in the art and, for example, certain of the aviation and other gas turbine fuels discussed in volume 3, third edition, ENCYCLOPEDIA OF CHEMICAL TECHNOLOGY, pages 328–351 (1979). Various hydrocarbon fuels which are particularly desirable for jet aircraft engines, are also described at column 6, lines 30–74 of U.S. Pat. No. 2,782,592 and at column 2, lines 28 to column 3, line 23 of U.S. Pat. No. 2,959,915 both of which are incorporated by reference herein in their entirety.

Although all of the foregoing hydrocarbon fluids can be used in the present invention, and the advantages of the present invention apply thereto, it is an unexpected advantage of the present invention that conventional, untreated, low-cost hydrocarbon fluids can be used as fuel in jet engines without special handling, without further treatment, without costly quality control procedures, and without the need for special processing either prior to or subsequent to loading the fuel in the aircraft. Furthermore, these same advantages apply to all other processes and systems which utilize hydrocarbon fluids including but not limited to, the petrochemical and plastics industries, the synthetic fuels industry, commercial and home heating industries and the like.

The articles of the present invention may be any component which is adapted to contact or contain hot hydrocarbon fluid, for example, liquid hydrocarbon jet engine or diesel fuel, heated at a temperature at which degradation products form in hydrocarbons, hydrocarbons circulating in conduits, heat exchangers and the like, of refineries, polymer plants and power plants, furnaces and the like. Such articles for containing hot hydrocarbon fluid are defined herein as fluid containment articles. Examples of such fluid containment articles are discussed above and include any device in which hot hydrocarbon fluid can be confined, stored, transported or otherwise subjected to heat exchange without ignition or combustion of the hot fluid. The present invention is particularly adaptable to heat transfer surfaces where heat is transferred from a combustor or other heat source through a wall to liquid hydrocarbon fluid. Specific examples of articles for containing or contacting hot hydrocarbon fluids in accordance with the present invention include fuel storage tanks, conduits for transporting liquid fuel, coils and other devices for heat exchange with fuel, fuel injector surfaces, nozzles and the like.

Other articles which may be coated by the process and with the special CVD coating materials of the present invention, e.g. effusive CVD coating materials of metal oxides and/or fluorides, include automobile and truck engine parts which are exposed to hot hydrocarbon fuel, e.g., gasoline, natural gas, diesel fuel and the like, including parts of engines in which air and fuel are mixed, vaporized and/or atomized. These parts include valves, cylinders, fuel injectors, fuel atomizers, combustion chambers and the like. The present invention also may be used in conjunction with manufacturing and other processes where fuel injectors, nozzles, valves and the like which may come in contact with hot fuels, are coated with the coating materials by the process of the present invention.

One fluid containment article is shown in FIG. 1 which represents a heat exchanger for cooling the high pressure turbine nozzle of a jet engine by transferring the heat generated therein to liquid hydrocarbon fuel confined in and transported through conduits or chambers adjacent the nozzle wall.

In FIG. 1, liquid hydrocarbon fuel enters the high pressure turbine nozzle at conduit 6 and passes through heat exchanger 2 where heat from combustion chamber 16, for example, operating at a temperature such that the walls of the nozzle which form chamber 16 have a temperature of about 1200° F. (about 649° C.), is cooled by the liquid hydrocarbon fuel passing through fuel passageway 2. Thus, there is heat exchange between the walls of chamber 16 and the liquid hydrocarbon fuel passing through passageway 2. Hydrocarbon fuel also passes through passageway 4 where heat exchange also occurs between the wall of the chamber 16 and the hydrocarbon fuel in passageway 4. Heated and vaporized hydrocarbon fuel 12 flows into chamber 16 through gas injection ports 10.

Figure 2:
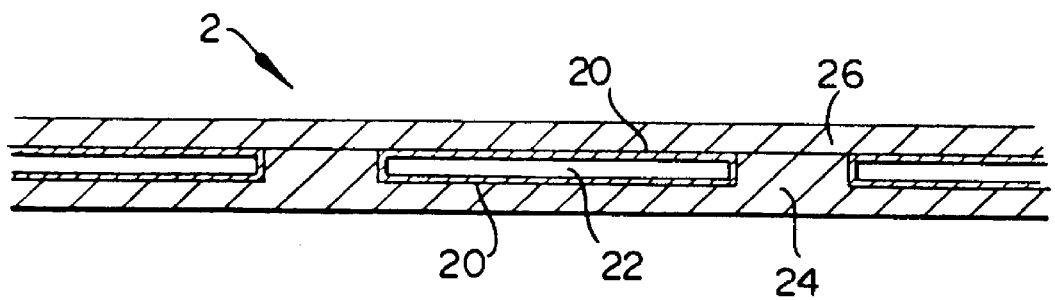
FIG. 2 is a sectional view taken along the line of II—II of FIG. 1 showing fuel containment passages for circulating distillate fuel.

Referring to FIG. 2 which shows in more detail the fuel containment passageway of FIG. 1, FIG. 2 being taken along the lines II—II of FIG. 1, hydrocarbon fuel passageway 2 contains walls 24 and 26 through which fuel passageway 22 is formed. Diffusion barrier material 20 of the present invention is coated by the CVD processes according to the present invention, i.e., by an effusive chemical vapor deposition process without the use of carrier gas, without pre-oxidation of the metal surface and at low temperatures, i.e., at temperatures of about 800° C. or less, e.g. between about 200° C. and about 750° C. and also at temperatures which will not thermally decompose the diffusion barrier material, on substrates 24 and 26 so that it forms a coating over the metal surfaces of passageway 22. Thus, numeral 20 in FIG. 2 represents the metal oxide, amorphous glass or metal fluoride material applied by the CVD processes according to the present invention, i.e., by an effusive CVD process without carrier gas, without pre-oxidation of the metal surfaces and without thermal decomposition of the coating material in accordance with the present invention.

Substrates 24 and 26 of FIG. 2, which represent the heat exchanger walls of chamber 16 in the high pressure turbine nozzle of FIG. 1, are generally constructed of any conventional material as well-known in the art. For example, such substrates may be stainless, steel, corrosion-resistant alloys of nickel and chromuium, high-strength, corrosion-resistant nickel-base alloys, and the like. It is these typical substrate materials which appear to cause or promote the formation of fuel thermal degradation products, such as gum, coke and/or sulfur compounds or mixtures thereof, in hydrocarbon fluids and fuels. It is the surface of substrates 26 and 24 which are adapted for contact with the hydrocarbon fuel by the formation of passageways, for example, as shown by numeral 22 in FIG. 2, therein.

Hydrocarbon fuel can be transported through passageway 22 by any appropriate means (not shown), and the hydrocarbon fuel as it passes through passageway 22 contacts the substrate. However, in accordance with the present invention, passageway 22 is actually formed from diffusion barrier material 20, i.e., a metal oxide or mixtures thereof, an amorphous glass or mixtures thereof or a metal fluoride or mixtures thereof or a combination of any of the foregoing, which have been coated by the CVD processes according to the present invention, e.g., by the effusive CVD process without the use of carrier gas, without pre-oxidation of the metal surface and preferably at low temperatures, i.e., at temperatures of about 800° C. or less, e.g., between about 200° C. and about 750° C. and also at temperatures which will not cause decomposition of the coated material, upon the metal surfaces of substrates 24 and 26 which form passageway 22. Accordingly, as the hydrocarbon passes through passageway 22, it actually contacts the effusive CVD deposited coating material 20. For best results, the layer or layers of coating material 20 are continuous and completely cover all surfaces of passageway 22 which are formed from substrates 24 and 26 and which provide a heat exchange relationship because of its contact with the hydrocarbon fuel.

In accordance with the present invention, the layer or layers of diffusion barrier material 20 which actually form passageway 22 by virtue of the continuous coating of the applied diffusion barrier material 20 on the surfaces of the passageway formed by substrates 24 and 26, are a diffusion barrier material which is catalytically-inactive and inhibits or prevents formation of coke, and is, for example, titania, silica, alumina, or spinel, deposited by the CVD processes according to the present invention, e.g., the effusive CVD process, wherein the applied diffusion barrier material is sufficient to prevent the formation of deposits resulting from sulfur, oxygen and mixtures thereof in hydrocarbon fuel with metal atoms at the surface of the passageway, i.e., wherein the diffusion barrier is a smooth, continuous and contiguous material of non-porous, atomically tight, dense, thermally stable metal oxide, amorphous glass, metal fluoride or mixtures thereof.

In certain preferred embodiments, material 20 is also a physical diffusion barrier to the hydrocarbon fuel and prevents contact between the fuel and the metal substrate, or more specifically, between the fuel and certain metal atoms which normally migrate from the metal substrate when it is contacted with the fuel. Thus, material 20 which coats substrates 24 and 26 and thereby forms passageway 22, is an inert or catalytically-inactive material which prevents, reduces or inhibits the formation of coke and/or sulfur compounds, and thereby prevents, reduces or inhibits the deposit of coke and/or sulfur compounds on the surfaces of the passageway.

As explained above, hydrocarbon fluids containing sulfur or oxygen react with metal atoms in a metal surface to form metal sulfide or metal oxides. These sulfides or oxides bond chemically to the surface providing a microscopically coarse, textured surface. Hydrocarbon fluid then fills the vacancies or irregularities in this textured surface where it stagnates and provides sufficient residence time required to form coke. The coke reaction is usually exothermic causing additional self-heating. As the coke molecules grow, they lock themselves within the micro-cavities or irregularities of the sulfide or oxide coated surface layer. Once anchored to the surface, the coke continues to grow by its own coarse nature, trapping additional coke-forming reactants.

In order to prevent coke formation, the present invention provides a coating which prevents metal-sulfur and/or metal-oxygen reactions. This is achieved by coating the metal surface with a thin, atomically tight coating, i.e., non-porous to the diffusion of metal atoms, e.g., iron, chromium and the like, through the coating and non-porous to the diffusion of hydrocarbon fluid and impurities therein through the coating, e.g., in preferred embodiments by coating the metal surface with a thin, atomically tight metal oxide coating. In accordance with the present invention, it has been found that the metal oxide coating, the amorphous glass coating and/or the metal fluoride coating, defined herein as diffusion barrier material, must be formed on metal substrates by those CVD processes which form a coating on a metal surface wherein the coating is of a porosity sufficiently low to prevent or inhibit the diffusion of metal (metal atoms) from the metal-surface on which it is coated through the coating, i.e., atomically tight, and is of a porosity sufficiently low to prevent the diffusion of hydrocarbon fluid and impurities therein through the coating, i.e., non-porous. An example of such a CVD process is the effusive chemical vapor deposition of an organometallic compound without the use of a carrier gas, without pre-oxidation of the metal substrate and at temperatures which do not decompose the metal oxide applied on the metal substrate. The coating is essentially a diffusion barrier between metal atoms in the surface and sulfur and/or oxygen in the hydrocarbon fluid.

The quality of the coating with respect to diffusion must be such that metal atoms, such as, iron, nickel and chromium, cannot diffuse through the surface and contact sulfur or oxygen in the fuel. Furthermore, the coating itself must have a surface with no vacancies or irregularities which will provide areas of stagnation when flowing hydrocarbon fluids contact the surface, thereby increasing the residence time of the fluid to the extent that coke will form therein and continue to grow and accumulate therein. Consequently, the coating deposited by the effusive CVD process in accordance with the present invention must be smooth.

The oxides and/or fluorides which can be used as diffusion barrier coatings on the surface of metal substrates in accordance with the present invention are those which can be deposited by the CVD processes according to the present invention, e.g., by effusive chemical vapor deposition without use of carrier gas and without thermal decomposition of the diffusion barrier material to form uniformly thin, e.g., about 0.1 to 5.0 microns in thickness, coatings which inhibit or prevent metal diffusion therethrough at temperatures up to about 1000° F. (about 538° C.). The oxide and/or fluoride coatings which are useful in the present invention, must also be thermally stable, i.e., they must not decompose or melt at operating temperatures, e.g., about 500°–1200° F. (about 260°–649° C.). The oxides and/or fluorides deposited in accordance with the present invention must be inert toward the metal substrate to which they are applied, i.e., they must be non-reactive with the metal in the metal substrate. The oxides and/or fluorides used as diffusion barrier coatings in accordance with the present invention must also be inert toward any hydrocarbon fluid which contacts the diffusion barrier coating, i.e., they must not react with, catalyze or otherwise convert the hydrocarbon fluids to decomposition products, defined herein as being non-reactive with the hydrocarbon. Alternatively stated, the oxides and/or fluorides used as diffusion barrier coatings must impede reactions in and with the hydrocarbon fluids, e.g., the coating material must not cause reactions which ultimately generate coke precursors.

The present invention is not limited to any particular organometallic compound for use in the CVD processes according to the present invention, e.g., the effusive CVD process. Any organometallic precursor compound which results in the deposit by the CVD processes according to the invention, e.g., by the effusive CVD process, of a metal oxide, amorphous glass or metal fluoride coating sufficient to form a diffusion barrier between metal atoms in the surface of the substrate and sulfur and/or oxygen in the hydrocarbon fluid and thereby prevents the formation of metal sulfide and/or metal oxide deposits from the fuel-metal substrate interaction so that there is sufficient residence time for the formation of coke in irregularities and vacancies formed in such metal sulfide and/or metal oxide deposits, may be used in accordance with the present invention.

In accordance with the present invention, the preferred oxides and fluorides are binary and ternary metal oxides and fluorides which prevent diffusion of metals in the metal wall into the hydrocarbon fluid where they cause reactions between impurities in the hydrocarbon fluid and metals from the wall. These select oxides and fluorides must be: (1) contiguous, dense and "atomically tight" enough to prevent significant metal diffusion at temperatures up to about 1000° F. (about 538° C.); (2) thermally stable up to high temperatures, e.g., about 500°–1200° F. (about 260°–649° C.), thereby eliminating, for example, silver oxide ($Ag_2O$) as a diffusive CVD coated oxide for diffusion barrier coatings; (3) non-reactive with the metal wall, thereby eliminating, for example, lithium oxide, ($Li_2O$), sodium oxide ($Na_2O$), and calcium oxide (CaO) as effusive CVD coated oxides for diffusion barrier coatings; and (4) not prone to catalyze, e.g., by oxidation/reduction, the hydrocarbon fluids to form or promote the formation of hydrocarbon cyclic aromatic and other undesirable coke precursors, thereby eliminating, for example, oxides of iron, cobalt, copper, lead, most transition metal oxides, and most metal oxides of the multivalent group VIII metals of the Periodic Chart of the elements as effusive CVD coated oxides for diffusion barrier coatings. By use of the term "dense" herein, is meant 98% and greater of the bulk density, i.e., non-porous.

The following binary oxides which can be deposited on metal surfaces by the effusive CVD process, are among the preferred metal oxide diffusion barrier coating materials of the present invention:

| | |
|---|---|
| $Al_2O_3$ | Aluminum oxide (alumina) |
| $HfO_2$ | Hafnium oxide (hafnia) |
| $TiO_2$ | Titanium oxide (titania) |
| $Sc_2O_3$ | Scandium oxide (scandia) |
| $Y_2O_3$ | Yttrium oxide (yttria) |
| $ThO_2$ | Thorium oxide (thoria) |
| $SiO_2$ | Silicon oxide (silica) |
| $Ga_2O_3$ | Gallium oxide (gallia) |
| $In_2O_3$ | Indium oxide (india) |
| $GeO_2$ | Germanium oxide (germania) |
| MgO | Magnesium oxide (magnesia) |
| $Ln_2O_3$ | where Ln = La, Ce, Pr, Nd, Pm, Sm, Eu, Gd, Tb, Dy, Ho, Er, Tm, Yb or Lu, i.e. any rare earth oxide. |

Other oxides which may be used in accordance with the present invention, include any amorphous glass having the composition $XSiO_2 + YB_2O_3 + ZP_2O_5$ where $X+Y+Z=1$ where $Y<0.5$ and $Z<0.5$.

Any ternary oxide containing the above listed binary oxides such as; for example,

| | |
|---|---|
| $MgAl_2O_4$ | magnesium aluminum oxide (spinel) |
| $Y_2Si_2O_7$ | yttrium silicon oxide (yttrium silicate) |
| $Y_3Al_5O_{12}$ | yttrium aluminum garnet |
| $Ln_3Al_5O_{12}$ | rare earth aluminum garnet may also be used as diffusion barrier coatings in accordance with the present invention. | be used as diffusion barrier coatings in accordance with the present invention.

The diffusion barrier coatings of the present invention also include binary fluorides which meet the above-designated criteria, for example,

| | |
|---|---|
| $BaF_2$ | barium fluoride |
| $LnF_3$ | where Ln = La, Ce, Pr, Nd, Pm, Sm, Eu, Gd, Tb, Dy, Ho, Er, Tm, Yb or Lu, i.e., any rare earth fluoride |
| $MgF_2$ | magnesium fluoride | and any metal oxy-fluorides of the composition:

| | |
|---|---|
| LnOF | where Ln = La, Ce, Pr, Nd, Pm, Sm, Eu, Gd, Tb, Dy, Ho, Er, Tm, Yb, or Lu, i.e., any rare earth oxy-fluoride. |

Ternary fluorides which may be used in the method and articles of the present invention include $BaMgF_4$, $EuMgF_4$ or $Ba_2MgF_6$.

In accordance with the present invention, mixtures of these oxides, mixtures of these fluorides, mixtures of these oxide(s) and fluoride(s) and simple (neat) or composite oxides or fluorides can be deposited by the effusive CVD process on the metal substrates.

Although there is not intention to be limited to any particular organometallic compound which may be used as a precursor in the CVD processes according to the invention, e.g., the effusive CVD process, to deposit the respective oxides, amorphous glasses and metal fluorides, the following are examples of organometallic compounds which may be used in the present invention: disopropyl ethylacetoacetate aluminum as the precursor for alumina, hafnium dipivalonate as a precursor for hafnia, titanium ethoxide as the precursor for titania, scandium acetylacetonate as the precursor or scandia, yttrium dipivalonate as the precursor for yttria, thorium acetylacetonate as the precursor for thoria, silicon ethoxide as the precursor for silica, gallium acetylacetonate as the precursor for gallia, indium acetylacetonate as the precursor for india, germanium ethoxide as the precursor for germania, magnesium dipivalonate as the precursor for magnesia, magnesium aluminum isopropoxide as the precursor for spinel, yttrium dipivalonate and silicon acetate as the precursor for yttrium silicate, barium heptafluoro-octanedionate as the precursor for barium fluoride, magnesium heptafluoro-octanedionate as the precursor for magnesium fluoride, tantalum ethoxide dimer as the precursor for tantala, zirconium di-isopropoxide diacetylacetonate as the precursor for zirconia and a mixture of silicon ethoxide, boron triethoxide and triethyl phosphate as the precursor for amorphous glass. As an organometallic precursor compound for the $Ln_2O_3$ binary metal oxides, generally the dipivalonate of the particular element represented by Ln may be used in the effusive CVD process for the method of the present invention. For the $LnF_3$ binary fluorides, generally the heptafluoro-octanedionate of the particular element represented by Ln may be used in the effusive CVD process of the present invention. Mixtures of magnesium and barium heptafluoro-octane dionates are examples of organometallic precursor compounds which may be used in the effusive CVD process to make the ternary metal fluorides of the present invention.

Although the thickness of the diffusion barrier coating material, that is, the metal oxide, amorphous glass and/or metal fluoride coating is not critical, the metal oxide, amorphous glass and/or metal fluoride coating can be quite thin, preferably on the order of about 0.2 micron in order to prevent micro-cracking due to surface stresses which could degrade the diffusion barrier nature of the coating. In certain preferred embodiments, the metal oxide, amorphous glass or metal fluoride is about 0.1 micron to about 5.0 microns or greater, there being no critical upper limit.

The metal oxides, amorphous glass and/or metal fluorides which may be coated on the surface of a metal substrate to produce a diffusion barrier coating, and thereby prevent or inhibit fuel thermal reaction products, such as coke, metal sulfides, gums followed by polymers, and other products from the hydrocarbon, must be deposited by the CVD processes according to the present invention, e.g., by the effusive chemical vapor deposition process.

In accordance with the present invention, the effusive chemical vapor deposition must be carried out at a temperature at which the deposited metal oxide, e.g., amorphous metal oxide, does not decompose, i.e., convert to the metallic or some other form. In order to prevent such decomposition, the effusive CVD process is carried out at temperatures of about 800° C. or less, e.g., at about 200° C., to about 750° C., and more preferably at about 400° C. to about 550° C. depending upon the particular coating material. In accordance with the present invention, heat may be applied as well known in the art by conventional means, e.g., an oven or vacuum furnace, and/or the article being coated may be heated by induction heating and the like. Although the pressure at which the effusive chemical vapor deposition is carried out is not critical, in preferred embodiments, the pressure is about 50 milliTorr to about 500 milliTorr.

In accordance with certain aspects of the present invention, it has been found that low temperature CVD processes, e.g., low temperature effusive CVD processes, provide superior diffusion barrier articles. When low temperature CVD processes are used, the applied diffusion barrier coating, i.e., the metal oxide and/or metal fluoride, requires no annealing, and, in accordance with the present invention, annealing is excluded from the process. As used herein, low temperature CVD processes, e.g., low temperature effusive CVD processes, are defined as those CVD processes which are carried out at a temperature of about 800° C. or less and preferably at temperatures of about 200° C. to about 750° C., i.e., the temperature at which the precursor gas is heated and/or the temperature at which the heated gas is applied on the substrate being coated. Optimum low temperatures vary depending upon the particular compound utilized as the precursor for the diffusion barrier material. For example, it has been found that by using an effusive CVD process, silica may be applied to a substrate at temperatures of about 350° C. to about 750° C.; zirconia may be applied at temperatures of about 350° C. to about 425° C. and preferably at about 380° C.; and tantala may be applied at a temperature of about 400° C. to about 460° C. and preferably at about 420° C.

As indicated above, the particular precursor is determinative of the effusive CVD process. For example, when silica is applied from silicon ethoxide by effusive CVD, the process is carried out at a temperature of about 650° C. to about 750° C. and more preferably, about 690° C. to about 710° C.; when silica is applied from silicone tetrakisdiethylhydroamine $((C_2H_5)_2)NO)_4$ by effusive CVD, the process is carried out at a temperature of about 350° C. to about 425° C. and more preferably, about 370° C. to about 390° C.; and when silica is applied from silicon tetraacetate by effusive CVD, the process is carried out at a temperature of about 450° C. to about 550° C. and more preferably, about 490° C. to about 510° C. By the process of the present invention, the low temperature CVD, e.g., the low temperature effusive CVD process, results in the homogeneous application of the metal oxide and/or metal fluoride.

Tantala and zirconia are discussed and claimed as coating materials in a copending U.S. patent application entitled "Coated Article for Hot Hydrocarbon Fluid and Method of Preventing Fuel Thermal Degradation Deposits" filed by George A. Coffinberry.

In accordance with other aspects of the present invention, the metal of the metal substrate having a surface which is coated in accordance with the process of the present invention, may be simultaneously tempered during the effusive chemical vapor deposition process. The temperatures at which effusive CVD is carried out in accordance with the present invention, are sufficient to heat the metal in the metal substrate at temperatures which temper the metal. When heat treatable steel is used, it may be desirable to temper the steel to improve the properties of the substrate, e.g., to improve homogeneity and the like as well known in the art.

Tempering modifies the properties of various steels, e.g., quench-hardened steels, to produce a more desirable combination of strength, hardness and toughness than obtained in the quenched steel. More than one tempering cycle may be necessary to produce an optimum structure using temperatures well known in the art. For example, in certain cases this can be better accomplished by two or more shorter tempering cycles than by single and longer cycle as explained in Metals Handbook, 8th edition, volume 2, pp. 223–224 where recommended temperatures and approximate heating times are shown for tempering certain steels. In accordance with the present invention, the final tempering cycles of the metal substrate can occur simultaneously with the application of said metal oxide, amorphous glass, metal fluoride or mixture thereof.

As used herein, effusive CVD, i.e., effusive chemical vapor deposition, or any CVD process which deposits a smooth, continuous, contiguous, dense, atomically tight, non-porous thermally stable coating according to the present invention, is the vapor deposition of a metal oxide and/or metal fluoride on a surface, the metal oxide and/or metal fluoride being derived from an organometallic compound, preferably a gaseous organometallic compound, at a temperature of about 800° C. or less and more preferably at temperatures of about 200° C. to about 750° C., preferably at pressures less than atmospheric, e.g., at about 50 milliTorr to about 500 milliTorr, without the use of a carrier gas.

In accordance with the present invention, when a CVD process according to the invention, e.g., the effusive CVD process, is used to deposit coatings on a surface, the surface must not be pre-oxidized. Pre-oxidation or any oxidation of a surface results in the formation of surface irregularities and/or roughness and reduces adhesion of the CVD coating material towards the substrate which is detrimental to the present invention. For example, as explained above, vacancies or irregularities, such as those caused by oxidation or pre-oxidation of the surface, increase residence time and promote the formation and accumulation of coke.

The coatings of the present invention are applied to the metal of the metal substrate, and accordingly, in preferred embodiments, the metal surface is a clean metal surface from which grease, grime, dirt and the like have been removed. Any conventional cleaning method or cleaning agent may be used to clean the metal surface as long as it does not roughen, deform or cause surface irregularities or vacancies which increase the residence time of flowing fluid in contact therewith. In certain preferred embodiments, the cleaning agent is a conventional organic solvent, e.g., liquid hydrocarbons. One class of liquid hydrocarbons typically used to clean surfaces is the mono- and dialkyl-ethers of ethylene glycol and their derivatives. Any cleaning method or agent used in accordance with the present invention must not cause oxidation of (or the formation of oxides on) the metal surface. Such oxides cause surface irregularities and vacancies and interfere with the effectiveness of the coatings, e.g., the metal oxide coatings applied by the effusive CVD process in accordance with the present invention. As used herein, the coatings applied by the present invention are applied coatings which are distinguished from formed coatings which are the result of chemical reaction between the metal atoms in the substrate and various metals in the hydrocarbon fuels, e.g., oxygen and sulfur. Thus, the metal oxide applied by the effusive CVD process in accordance with the present invention is an applied metal oxide, and a metal oxide resulting from the reaction between oxygen in the fuel and metal atoms in the substrate is a formed metal oxide.

Furthermore, the CVD processes according to the invention, e.g., the effusive CVD process, must be carried out at temperatures which do not decompose the coating material. As used herein, any temperature which converts or transforms or otherwise causes a reaction in or of the deposited diffusion barrier material to another form, or otherwise causes a reaction in or a reaction of the deposited material, is a temperature which decomposes the deposited material. For example, when the deposited material is a metal oxide and the temperature is reached at which metal in the metal oxide is converted to the metallic form, it is defined herein as thermal decomposition of the metal oxide. Accordingly, the CVD processes according to the present invention, e.g., the effusive CVD process, are carried out at temperatures of about 800° C. or less and preferably at temperatures of about 200° C. to about 750° C. to avoid thermal decomposition of the deposited diffusion barrier material. At these temperatures, the integrity and effectiveness of the coating material are maintained and decomposition of the coatings is avoided.

The length of time required to carry out the CVD processes according to the invention, e.g., the effusive CVD process, is not critical, the length of time of exposure of the metal substrate to the organometallic compound being dependent on the thickness of the coating desired on the surface of the substrate. It is only necessary to treat the surface of the metal substrate by the effusive or other CVD process according to the invention until the desired thickness of the layer or layers of coating material is achieved, and one skilled in the art can determine the length of time required to achieve the desired thickness of coating material without undue experimentation by subjecting the surface of the metal substrate to the organometallic compound at a designated temperature and pressure until the desired thickness of the coating is achieved, e.g., until the thickness of the deposited metal oxide is about 0.4 micron.

In certain preferred embodiments, the metal oxide is amorphous so as to be homogeneous and closely packed (dense or atomically tight) in order to prevent diffusion and contact between the fluid and metal atoms in the metal substrate, especially in the case of the diffusion barrier material. Non-amorphous or crystalline metal oxides can also be deposited on substrates in accordance with the present invention as long as such deposits or coatings form a continuous, closely packed (dense or atomically tight) coating which is sufficient to prevent diffusion and contact between the fluid and metal atoms in the metal substrate.

Although the present invention has utility in any fuel containment article or in any fuel containment system in which fuel does not undergo combustion, and it is particularly useful in forming a diffusion barrier coating in fuel containment articles and fuel containment systems wherein the fuel is used as a heat exchange medium to remove heat from various systems in gas turbines, both industrial and those used in aircraft and the like, it is particularly useful in the heat exchanger surface in fuel systems of a gas turbine, a scramjet engine, a ramjet engine, or a turbojet engine or as a conduit for transporting heating hydrocarbon fuel in a fuel system of any of the foregoing. Unlike the prior art processes and fluid containment articles and systems, the processes and fluid containment articles of the present invention can use conventional low-cost fluids without any disadvantage. The prior art processes and fluid containment articles must use fuels containing additives, special fuel processing procedures and/or special handling, all of which are costly, create additional problems and generate or promote the generation of $NO_x$. With the processes and articles of the present invention, there is a substantially improved system in which $NO_x$ generation can be minimized.

Application of the benefits to be derived from the present invention are quite extensive. One application of these benefits is to provide a heat exchanger surface which can be used to gasify jet fuel without fouling of the heat exchanger surface. The gaseous fuel can then be injected into a gas turbine combustor in a uniform fashion rapidly mixing with air so as to burn at a uniform temperature. Such uniform temperature combustion would substantially reduce the formation of nitrogen oxide pollutants. Another application would also involve heating the jet fuel to a very high temperature during use as a capacious heat sink for cooling various engine and aircraft parts and systems, such as the air used for cooling the engine turbine blades, discs and vanes. Another application would involve coating parts such as fuel nozzles, injectors, and flow distribution jets so as to avoid deposit buildup which would plug the nozzles, injectors and jets. Another application would involve coating of valves so as to avoid sticking and seizing from gums or cokes. These and other applications and benefits of the present invention will become obvious to those skilled in the art based on the teachings of the present invention.

The following specific examples describe the methods and articles of this invention. They are intended for illustrative purposes only and should not be construed as limited the present invention.

EXAMPLES

Specific tests have been conducted on metals which are typically used for walls and materials for parts which contact hot hydrocarbons and normally form coke deposits thereon. The diffusion barrier materials were deposited on the metals by effusive chemical vapor deposition (CVD) in thicknesses of about 0.2–1.5 microns. Alumina ($Al_2O_3$), silica ($SiO_2$), titania ($TiO_2$) and spinel ($MgAl_2O_4$) were deposited on the metals and are representative of the oxides and fluorides which are diffusion barrier coating materials, of the present invention.

Example 1

Type 321 stainless steel coupons containing iron, chromium and nickel were used as the materials representing typical metal walls. Test coupons were in the as-rolled condition with about 32 RMS surface finish. These coupons are representative of the typical metal chemistry and surface texture of steel tubing used, e.g., to convey hydrocarbon fluids, such as kerosene fuel. The test coupons were coated with the particular oxide by the effusive CVD technique described below.

A stainless steel planchette or coupon measuring 50 mm long by 8 mm wide by 2 mm thick made from 321 stainless steel was coated with a 0.4 micron thick layer of silica ($SiO_2$) by an effusive chemical vapor deposition process. The planchette was cleans with a non-oxidizing cleaning agent to remove grease, and placed in a heated vacuum furnace maintained at a pressure between about 50 milliTorr to about 500 milliTorr. Heat was applied at a temperature of about 400°–450° C. to an organometallic precursor, silicon tetra-acetate, for $SiO_2$, in the furnace. The silicon acetate organometallic precursor flowed over the substrate and deposited $SiO_2$ onto the substrate surface. No carrier gas was used. This resulted in about a 0.4 micron thickness of atomically tight amorphous $SiO_2$ coating deposited on the planchette.

Figure 3:
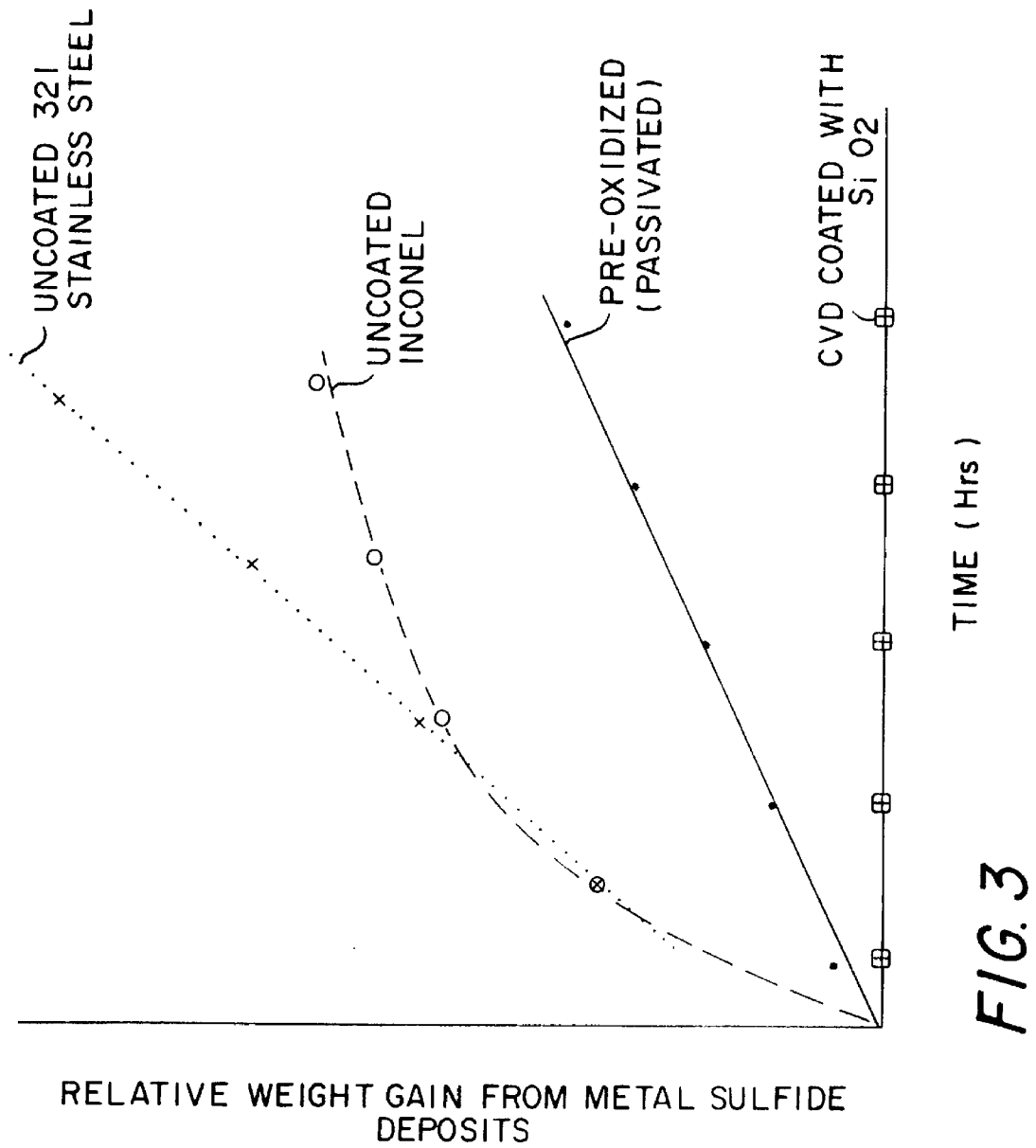
FIG. 3 is a graph showing the relative weight gain of various metal coupons exposed to metal sulfide over a period of time.

Coated and uncoated test coupons were exposed to concentrated levels of sulfur in the form of flowing thioacetamide ($CH_3CSNH_2$)/$N_2$ gas (1%/99%) at 450° C. (842° F.) at one atmosphere pressure for 1 to 3 hours. Relative weight gain from metal sulfide deposits vs. time is shown in FIG. 3. FIG. 3 is a comparative statement of relative amount of sulfide deposit versus comparable exposure time (in hours) for each of the samples shown in the graph. Note that the effusive CVD coated $SiO_2$ coupon developed no sulfide deposits, thus indicating the effectiveness of the $SiO_2$ diffusion barrier deposited by the effusive CVD process in preventing sulfide deposits. Pre-oxidized (passivated in oxygen gas) coupons showed a slight (but inconsequential) improvement over the uncoated 321 stainless steel metal. An uncoated coupon of INCONEL® 718 nickel/chromium stainless is also shown for comparison to uncoated 321 stainless steel and coatings applied by the CVD process of the present invention.

Example 2

Effusive CVD $SiO_2$ coated, uncoated and pre-sulfurized 321 stainless steel coupons were exposed to flowing chemically-pure decane, octane and dodecane gas, which is representative of the pure (hydrocarbon) chemistry of aircraft Jet-A kerosene fuel. The effusive CVD $SiO_2$ coated coupons were coated as described in Example 1. After 5 to 10 hours of exposure at the same conditions as the thioacetamide tests in Example 1, there were no deposits formed on the effusive CVD $SiO_2$ coated coupons. Uncoated coupons showed very small amounts of coke deposit. Coupons which had preexisting deposits of metal sulfides from the thioacetamide test showed very large coke deposits. Thus, the effusive CVD $SiO_2$ coatings inhibited coke deposits, and the metal sulfide deposits promoted coke deposits. Microprobe analysis of the deposits showed that chromium diffused to the metal surface to form a sulfide deposit. Iron diffused from the metal surface, through the sulfide deposit to the surface of the coke deposit, and nickel diffused through all deposits leaving the surface as a sulfide.

Example 3

Several coated and uncoated 321 stainless steel coupons were placed together in a gold plated fixture and subjected to simulated flowing conditions of ordinary Jet-A kerosene fuel. Ordinary Jet-A fuel may contain as much as 0.4% by weight, of free sulfur and sulfur compounds. The test was run at 400 psi (27.2 atmospheres) and 500° C. (932° F.) for 62 hours. The test coupons were examined after 2, 18 and 62 hours. Jet-A liquid flow rate was 80 ml/min (1.27 gal. per hour) with supercritical gaseous flow Reynolds number in excess of 10,000 over the coupons.

Figure 4A:
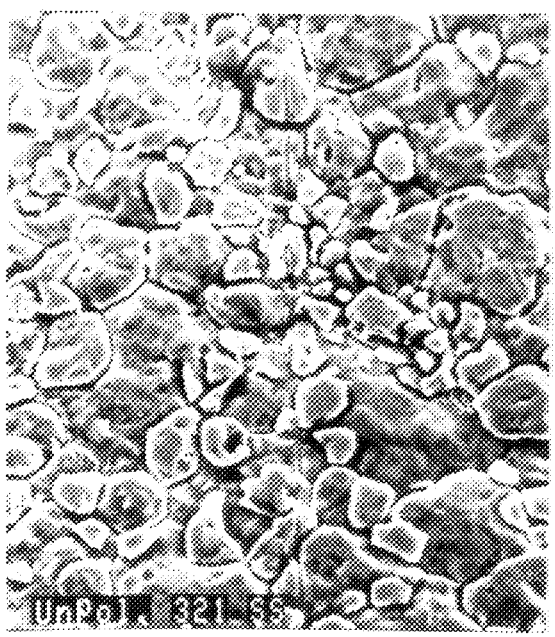
FIGS. 4A, 4B and 4C are scanning electron beam micrographs (magnified 2000×) of a coupon of 321 stainless steel before testing (FIG. 4A), after exposure to Jet-A fuel at 500° C. for 2 hours (FIG. 4B), and after exposure to Jet-A fuel at 500° C. for 62 hours (FIG. 4C).
Figure 4B:
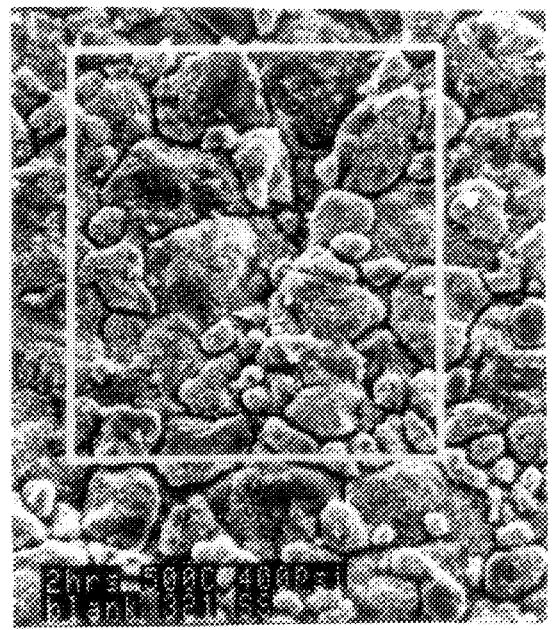
Figure 4C:
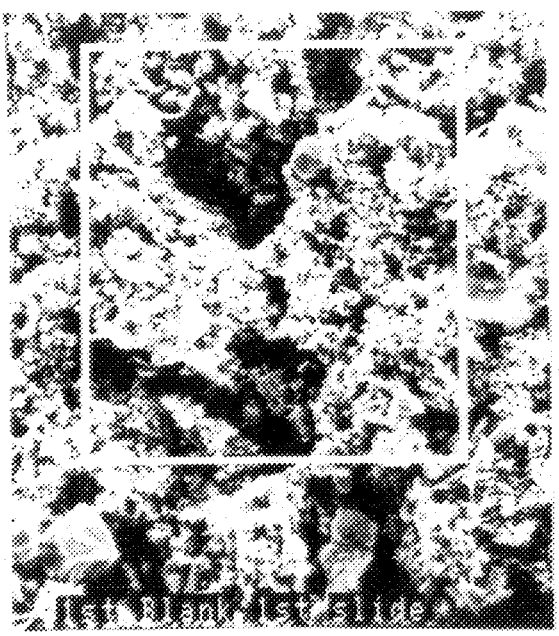

The results of the tests on the uncoated 321 stainless steel coupon are shown in FIG. 4A which shows an uncoated coupon at 2000× power before the test; FIG. 4B shows the uncoated coupon at 2000× after 2 hours of exposure; and FIG. 4C shows the uncoated coupon after 62 hours of exposure. FIG. 4C shows the deposit structure adhering to the surface. An additional coke deposit in excess of 0.005 inch thickness has been removed from the surface. These results indicate an average deposit growth rate of about 0.0001 inch per hour. Microprobe analysis of the deposits showed the crystals in FIG. 4B to be chromium and sulfur (chromium sulfide). The deposits in FIG. 4C are chromium/sulfur (chromium sulfide), iron/sulfur (iron sulfide) and carbon. The 0.0005 inch deposit removed from the surface was predominately carbon (coke).

Example 4

A stainless steel planchette or coupon having the dimensions shown above in Example 1 was cleaned with a non-oxidizing cleaning agent and place in a heated vacuum furnace. The pressure was maintained at between about 50 milliTorr to about 500 milliTorr. The oven was heated at about 400° C. to about 450° C. and an organometallic precursor for $Al_2O_3$, diisopropoxy aluminum ethylacetoacetate, was passed into the furnace and flowed over the heated substrate therein. $Al_2O_3$ deposited on the substrate surface at a thickness of about 1.2 microns. No carrier gas was used.

Figure 5A:
FIGS. 5A and 5B are scanning electron beam micrographs (magnified 2000×) of an alumina coated 321 stainless steel coupon according to the present invention before testing (FIG. 5A) and after exposure to Jet-A fuel at 500° C. for 62 hours (FIG. 5B).
Figure 5B:
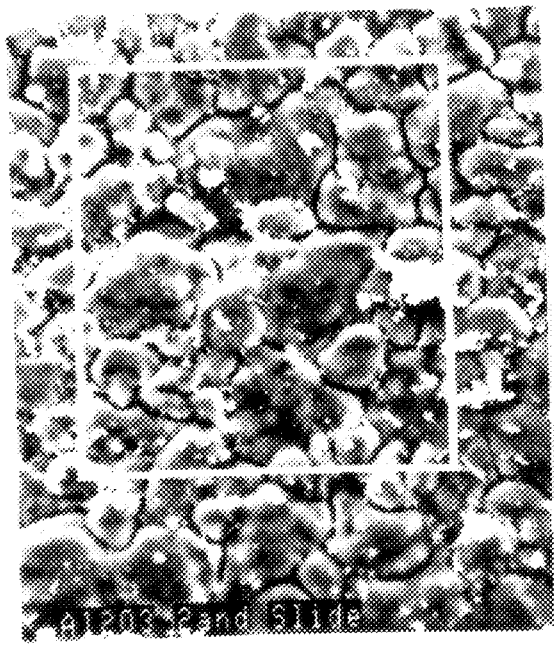

The results of tests conducted on a coupon coated with 1.2 microns of $Al_2O_3$ are shown in FIG. 5A which is before the test (virgin $Al_2O_3$) and FIG. 5B which is after 62 hours of exposure to Jet-A fuel at a temperature of 500° C. The few micron-size particles resting loosely on the surface are nickel sulfide which has migrated from deposits upstream of the $Al_2O_3$. As can be seen, no deposits have formed on the $Al_2O_3$ coated coupon. The photomicrograph (FIG. 5B) of the coupon exposed to Jet-A fuel at 500° C. for 62 hours shows that $Al_2O_3$ provides a good diffusion barrier but that it is somewhat lacking in surface continuity.

Example 5

Stainless steel coupons having the dimensions and cleaned as shown above in Example 1 were placed in a heated vacuum furnace. A coupon was coated with 1.5 microns (thickness) of $SiO_2$ as in Example 1. Another coupon was coated with 0.3 micron of $TiO_2$ by the effusive CVD method of Example 1 using titanium ethoxide as the organometallic precursor.

Figure 6A:
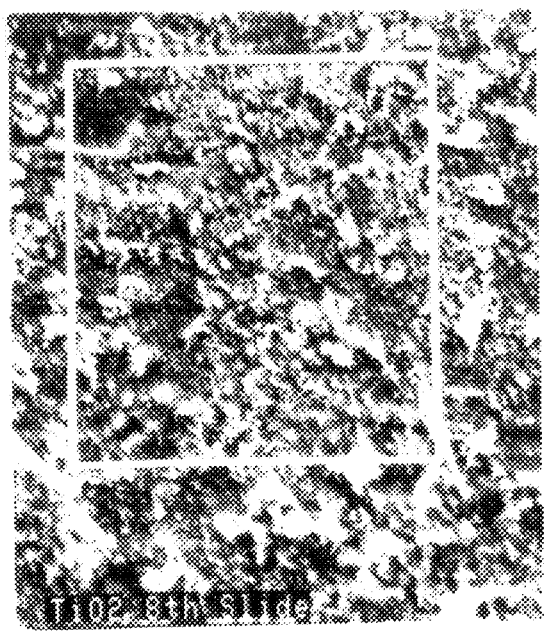
FIGS. 6A and 6B are scanning electron beam micrographs (magnified 2000×) of a titania coated 321 stainless steel coupon according to the present invention (FIG. 6A) and of a silica coated 321 stainless steel coupon according to the invention (FIG. 6B), each after exposure to Jet-A fuel at 500° C. for 62 hours.
Figure 6B:
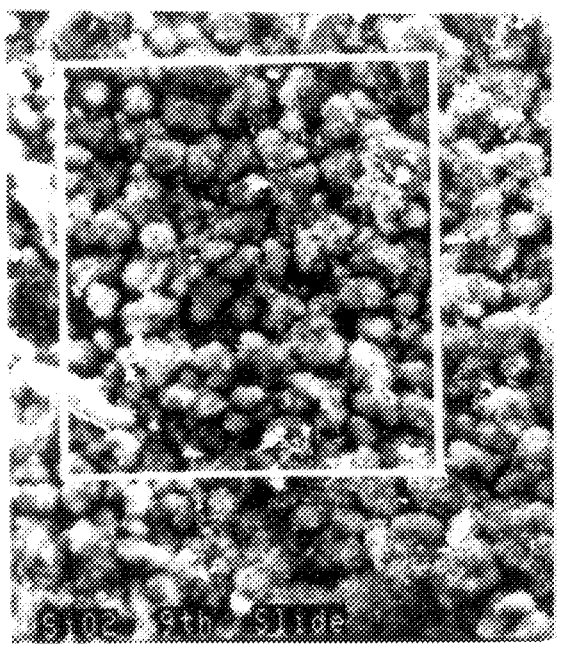

The results of tests conducted on titania and silica are shown in FIG. 6A which shows a photomicrograph at 2000× of a 321 stainless steel coupon coated with 0.3 micron of $TiO_2$ and FIG. 6B which shows a photomicrograph at 2000× of a 321 stainless steel coupon coated with 1.5 microns of $SiO_2$. These photomicrographs of coupons exposed to Jet-A fuel heated at 500° C. for 62 hours show that $SiO_2$ is reasonably good and relatively easy to apply and that with $TiO_2$, there is evidence of a small amount of diffusion barrier breakdown.

The gold plating used on the test figure was not effective in preventing coke deposits and was later replaced with a $SiO_2$ coating.

Example 6

A stainless steel planchette of 321 s.s. having the dimensions and cleaned as in Example 1 was placed in a heated vacuum furnace. The planchette was coated with spinel having a thickness of 0.5 micron by the effusive CVD method of Example 1 using aluminum magnesium isopropoxide as the organometallic precursor.

Figure 7A:
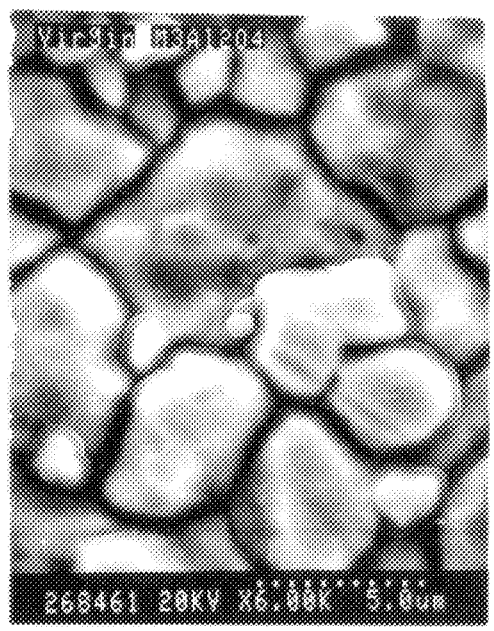
FIGS. 7A and 7B are scanning electron beam micrographs (magnified 2000×) of a spinel coated 321 stainless steel coupon before testing (FIG. 7A) and after exposure to Jet-A fuel at 500° C. for 62 hours (FIG. 7B).
Figure 7B:

The results of tests conducted on the spinel coating are shown in FIG. 7A which shows a photomicrograph at 2000× of the coupon coated with spinel before the test (virgin spinel) and FIG. 7B which shows a photomicrograph at 2000× of the coupon coated with spinel after about 62 hours of exposure to Jet-A fuel at 500° C. As can be seen, no deposits have formed on the spinel-coated planchette.

Example 7

A stainless steel planchette or coupon measuring 50 mm long by 8 mm wide by 2 mm thick made from 304 stainless steel was coated with a 0.4 micron thick layer of tantalum oxide, $Ta_2O_5$, by an effusive chemical vapor deposition process. The planchette was cleaned with a non-oxidizing cleaning agent to remove grease, and placed in a heated vacuum furnace maintained at a pressure between about 50 milliTorr to about 500 milliTorr. Heat was applied at a temperature of about 400° C.–450° C. to an organometallic precursor, tantalum ethoxide dimer ($Ta_2(OC_2H_5)_{10}$) in the furnace. The tantalum ethoxide dimer flowed over the substrate and deposited $Ta_2O_5$ onto the substrate surface. No carrier gas was used. This resulted in about a 0.4 micron thickness of atomically tight, dense amorphous $Ta_2O_5$ coating deposited on the planchette.

A test was conducted by flowing commercial grade Jet-A kerosene aviation fuel over the planchette for 8 hours at 521° C. (970° F.) and 420 p.s.i.a. A total of 0.74 pounds of hot (970° F.) fuel was passed over the planchette during he 8-hour test. No attempt was made to remove air from the fuel.

Figure 8:
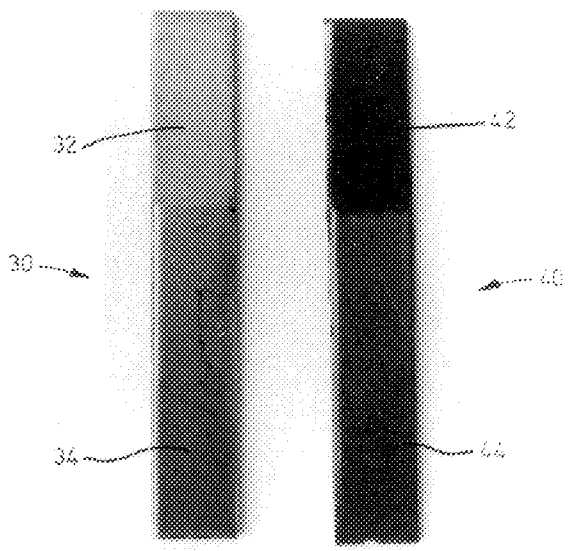
FIG. 8 is photograph of two 304 stainless steel coupons showing before and after exposures to hot jet-A fuel.

In FIG. 8, planchette 30 was photographed prior to exposure to coking conditions, that is, prior to the test set forth above. On planchette 30, lower portions or section 34 was coated and remained coated with the tantalum oxide, and upper portion or section 32 was sand blasted to remove the coating of tantalum oxide. Planchette 30 was exposed to the test conditions specified above, and after exposure to the flowing, hot Jet-A fuel, the planchette was removed and photographed and is shown as planchette 40 in FIG. 8.

Comparison of planchettes 30 and 40 shows that a deposit formed on uncoated (upper) portion 42 of planchette 40. After examination of coated region 44 and uncoated region 42 of planchette 40, the deposit on region 42 was removed by burning in oxygen to form carbon dioxide and sulfur dioxide. The total amount of deposit was determined to be 0.2 mg which corresponds to a deposit rate of 3.1 micrograms/hr/cm$^2$ for the 8-hour test. Based on prior tests of uncoated samples, it is judged that the deposit rate is highest during initial exposure (up to 100 micrograms/hr/cm$^2$ for a 0.5 hour duration test), and that the weight ratio of carbon to sulfur composition of the deposit is about 2 to 1.

Figure 9A:
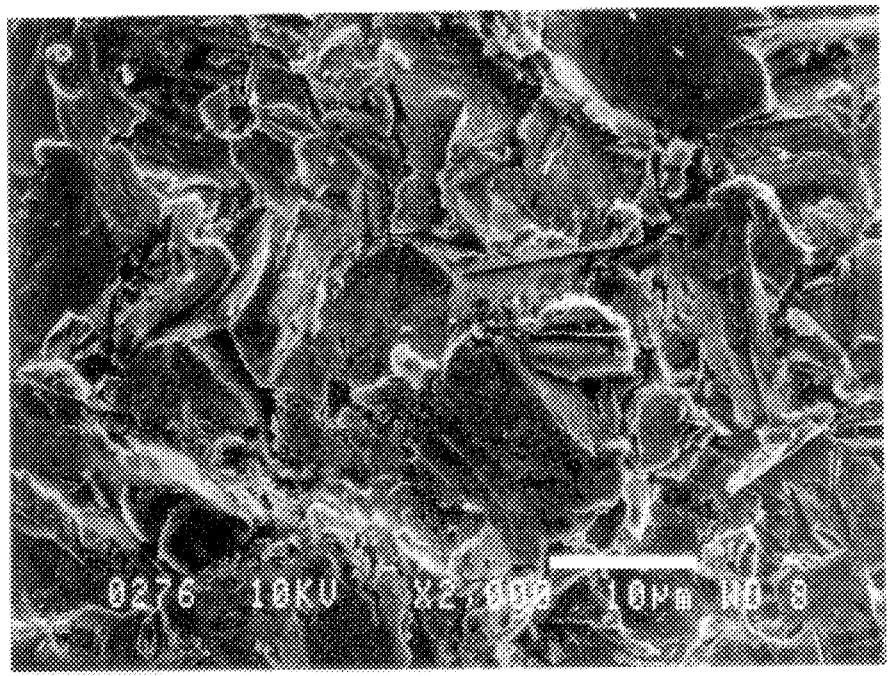
FIGS. 9A, 9B, 9C and 9D are scanning electron beam photomicrographs (magnified 2000×) of a coupon of 304 stainless steel showing an uncoated (sand blasted) region before testing (FIG. 9A), of an uncoated area after exposure to jet-A fuel at 521° C. (970° F.) for 8 hours (FIG. 9B), of $Ta_2O_5$ coated 304 stainless steel coupon before testing (FIG. 9C) and of $Ta_2O_5$ coated 304 stainless steel coupon after exposure to jet-A fuel at 521° C. (970° F.) for 8 hours (FIG. 9D).
Figure 9B:
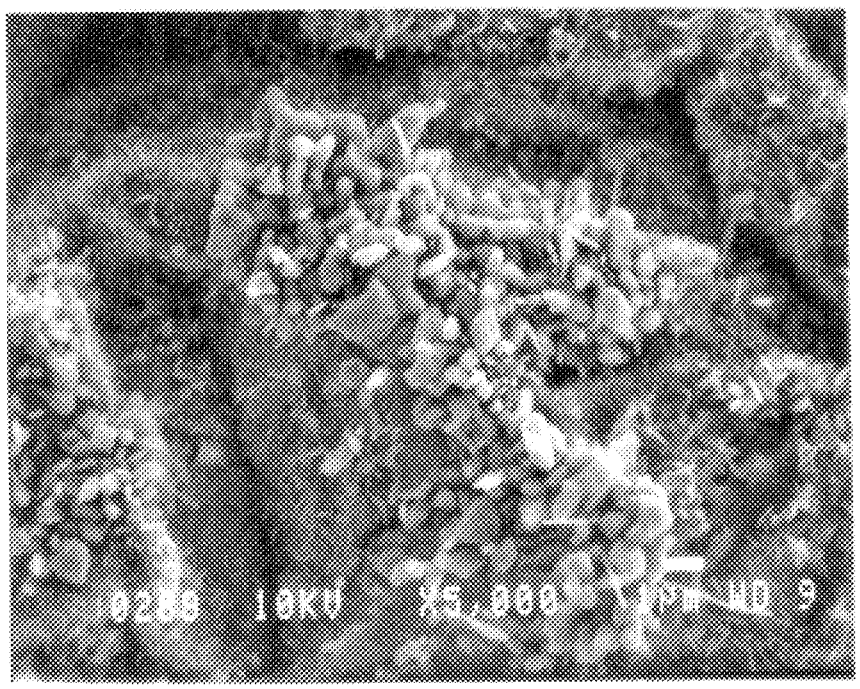

FIG 9A shows uncoated (sand blasted) region 32 of planchette 30 before the test. FIG. 9B shows the deposit formed on uncoated region 42 of planchette 40 after the test. The rock-shaped crystalline deposit shown in FIG. 9B was found to contain up to 30–40% sulfur. As the sulfur concentration in the Jet-A fuel is only about 200 ppm, this represents a high concentration in the deposit. These same crystals were determined by x-ray diffraction to be chromium sulfide, indicating that the sulfur impurities in the fuel reacted with chromium in the 304 stainless steel. No chromium could be found in the Jet-A fuel feed, hence the chromium had to come from the steel. The black appearance of the deposit is characteristic of either carbon or chromium sulfide, leading to the speculation that chromium sulfide could easily be misinterpreted as coke.

Figure 9C:
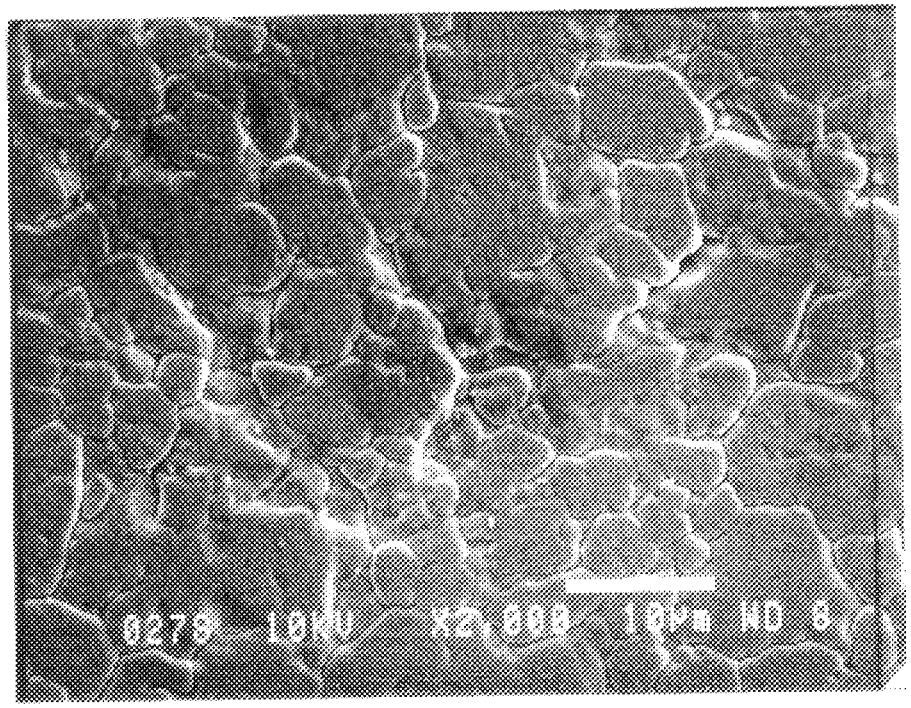
Figure 9D:
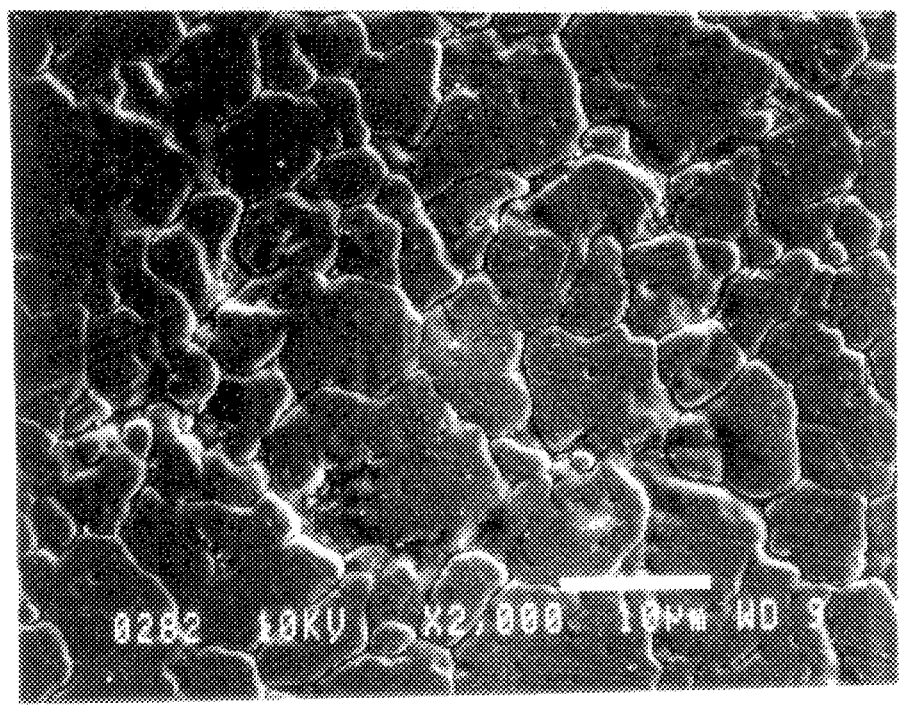
Figure 10A:
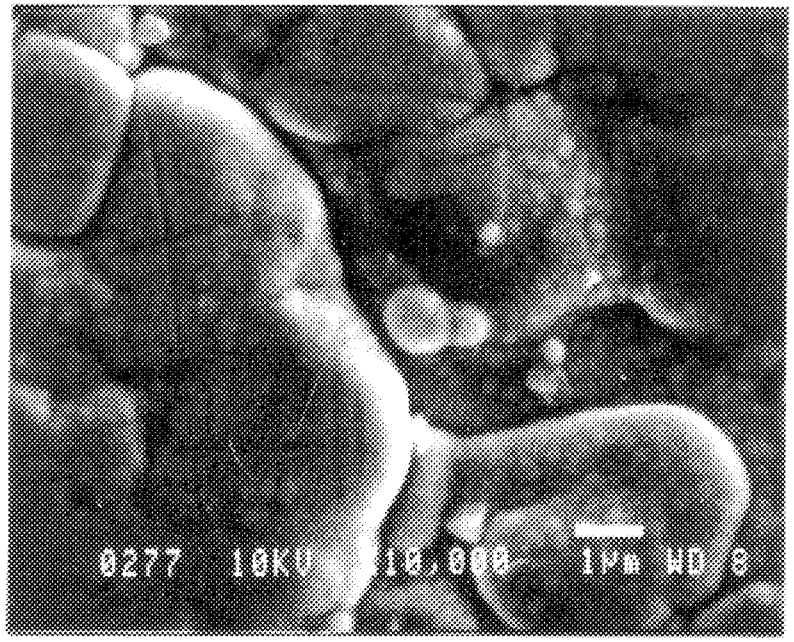
FIG. 10 is scanning electron beam photomicrographs (magnified 10000×) of a $Ta_2O_5$ coated 304 stainless steel coupon before testing (FIG. 10A) and of a $Ta_2O_5$ coated 304 stainless steel coupon after exposure to jet-A fuel at 521° C. (970° F.) for 8 hours (FIG. 10B).
Figure 10B:
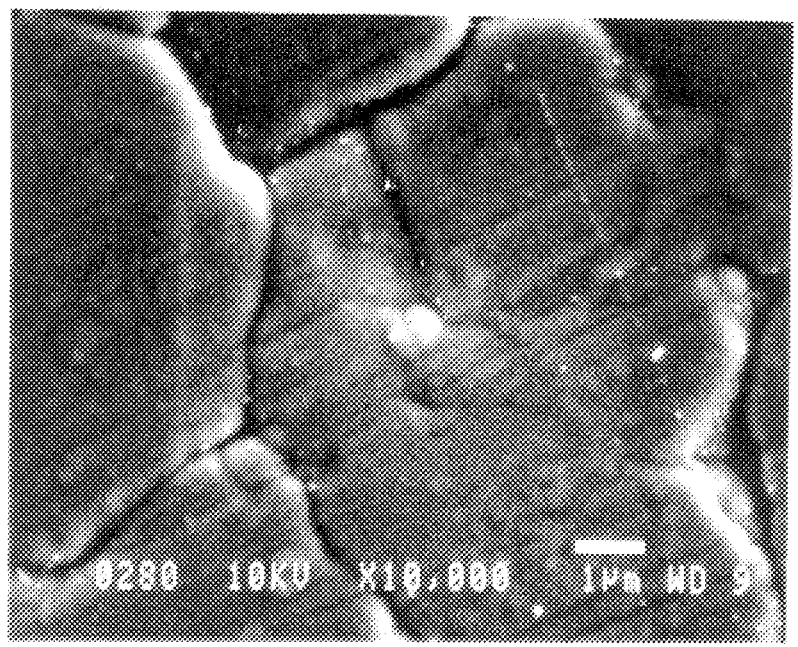

FIG. 9C shows coated portion 34 of planchette 30 before the test. FIG. 9D shows coated portion 44 (difference area) of the planchette after the test. In FIGS. 10A and 10B, magnified portions of coated portion 44, even at 10,000× magnification, demonstrate that there is no evidence of deposit on the $Ta_2O_5$ coated 304 stainless steel, FIG. 10A representing the 0.4 micron thick coated sample before the test and FIG. 10B representing the sample after the JET-A fuel test at 510° C. (950° F.) and 435 p.s.i.a., 0.08 pph for 7 hours. Clearly the $Ta_2O_5$ prevented contact between chromium in the metal and sulfur in the fuel. No other type of deposit was observed on the coating.

Example 8

A stainless steel coupon coated at a temperature of 700° C. with silica from silicon ethoxide by substantially the same process described in Example 1, was placed in a test chamber. Natural gas heated in 500° C. by resistance heating applied from outside the test chamber was passed into the chamber at a pressure of about 1.00 psi. After 100 hours of exposure of the effusive CVD $SiO_2$ coated coupons to natural gas, no deposits were found on the coupon. An uncoated test coupon, i.e., a stainless steel coupon, placed in the test chamber had deposits formed thereon.

The foregoing clearly establishes that oxides applied by effusive CVD act as diffusion barrier materials and prevent or retard diffusion between the metal substrates and hydrocarbons and thereby prevent or retard surface deposit formations.

Based on the foregoing results, it is further evident that other diffusion barrier materials can be formed from other metal oxides deposited on substrate metals and alloys using the effusive CVD process.

While other modifications of the invention and variations thereof which ay be employed within the scope of the invention, have not been described, the invention is intended to include such modifications as may be embraced within the following claims.

What is claimed is:

1. A method for preventing the deposit on a metal surface of thermal degradation products selected from metal sulfides, oxides or mixtures thereof, derived from the reaction of sulfur, oxygen or mixtures thereof in hydrocarbon fluid with metal atoms which diffuse to the metal surface, the method comprising the steps of processing the metal surface to be clean and oxide-free, and then applying to the clean and oxide-free metal surface a diffusion barrier coating comprising a dense, non-reactive, non-catalytic and thermally stable metal oxide, amorphous glass, or mixture thereof, said metal oxide, amorphous glass, or mixture thereof being applied by chemical vapor deposition from an organometallic precursor vapor without use of a carrier gas.

2. A method according to claim 1 for preventing the deposit on a metal surface of metal sulfides resulting from the reaction of sulfur impurities in hydrocarbon fluid with metal atoms from the metal surface; wherein the diffusion barrier coating comprises a binary or ternary oxide chosen from the group consisting of alumina, hafnia, titania, scandia, yttria, thoria, silica, gallia, india, germania, magnesia, a rare earth oxide, spinel, yttrium silicate, yttrium aluminum garnet, and rare earth aluminum garnets.

3. A method for preventing surface reaction which result in formation of deposits from hot hydrocarbon fluids in contact with an iron-, nickel-, or chromium-containing metal surface, the method comprising the steps of processing the metal surface to be clean and oxide-free, and then depositing on the oxide-free metal surface a smooth, continuous, dense, non-reactive, non-catalytic and thermally stable diffusion barrier coating comprising a metal oxide, amorphous glass or mixtures thereof, by chemical vapor deposition from an organometallic precursor vapor without use of a carrier gas.

4. A method according to claim 3, wherein the diffusion barrier coating comprises an amorphous metal oxide.

5. The method of claim 3 in which the metal oxide is a binary or ternary metal oxide.

6. The method according to claim 3 in which the diffusion barrier coating is selected form the group consisting of alumina, tantala, silica, titania, and spinel.

7. The method according to claim 3 in which the diffusion barrier coating is amorphous silica or tantala.

8. The method according to claim 3 in which the diffusion barrier coating is deposited by chemical vapor deposition at a temperature between about 200° and about 800° C. and a pressure of about 50 to about 500 milliTorr.

9. The method according to claim 3 in which the diffusion barrier coating is about 0.1 to about 5 microns thick and has a porosity of less than about 2 volume percent.

10. The method according to claim 3 in which said diffusion barrier coating is amorphous silica deposited on the metal surface by chemical vapor deposition from a precursor vapor consisting essentially of silicon ethoxide at a temperature between about 650° and 750° C. and a pressure of about 50 to about 500 milliTorr.

11. The method according to claim 3 in which said diffusion barrier coating is amorphous silica deposited on the metal surface by chemical vapor deposition from a precursor vapor consisting essentially of silicon tetraacetate at a temperature between about 350° and 550° C. and a pressure of about 50 to about 500 milliTorr.

12. The method according to claim 3 in which said diffusion barrier coating is amorphous alumina deposited on the metal surface by chemical vapor deposition from a precursor vapor consisting essentially of diisopropyl-ethylacetoacetate aluminum at a temperature between about 200° and 450° C. and a pressure of about 50 and 500 milliTorr.

13. The method according to claim 3 in which said diffusion barrier coating is titania deposited on the metal surface by chemical vapor deposition from a precursor vapor consisting essentially of titanium ethoxide at a temperature between about 200° and 500° C. and a pressure of about 50 to about 500 milliTorr.

14. An article of manufacture for contact with hot hydrocarbon fluid at a temperature above about 300° F. and having an iron-, nickel-, or chromium-containing metal surface in which the metal surface is free of a formed metal oxide and has thereon an applied smooth, continuous, dense, non-reactive, non-catalytic and thermally stable diffusion barrier coating consisting of a metal oxide, amorphous glass or mixtures thereof, which substantially prevents diffusion of metal atoms and the hydrocarbons fluid through the diffusion barrier coating.

15. The article of claim 14 wherein the diffusion barrier coating is an amorphous oxide selected from the group consisting of alumina, silica, titania, tantala, and spinel.

16. The article of claim 14 wherein the diffusion barrier coating is silica.

17. The article of claim 14 wherein the diffusion barrier coating is amorphous alumina.

18. The article of claim 14 wherein the diffusion barrier coating is titania.

19. The article according to claim 14 in which the diffusion barrier coating is about 0.1 to about 5 microns thick and has a porosity of less than about 2 volume percent.

20. The article according to claim 14, wherein the article is a heat exchanger with the diffusion barrier coating contacting the hot hydrocarbon fluid, the diffusion barrier coating consisting of an oxide selected from the group consisting of alumina, tantala, silica, titania, and spinel.

21. The article according to claim 14, wherein the article is selected from the group consisting of a fuel injector, a fuel valve, a fuel nozzle, a combustor turbine nozzle and a piston, the metal surfaces being coated by the diffusion barrier coating such that the diffusion barrier coating contacts the hot hydrocarbon fluid, the diffusion barrier coating consisting of an amorphous oxide selected from the group consisting of alumina, tantala, silica, titania, and spinel.

* * * * *